United States Patent
Chang et al.

(10) Patent No.: US 9,589,642 B2
(45) Date of Patent: Mar. 7, 2017

(54) LEVEL SHIFTER AND DECODER FOR MEMORY

(71) Applicant: Macronix International Co., Ltd., Hsinchu (TW)

(72) Inventors: Ming-Yi Chang, Zhubei (TW); Chien-Ping Tai, Zhubei (TW); Shin-Jang Shen, Zhubei (TW); Chung-Kuang Chen, Hsinchu (JP)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 181 days.

(21) Appl. No.: 14/454,510

(22) Filed: Aug. 7, 2014

(65) Prior Publication Data
US 2016/0042794 A1  Feb. 11, 2016

(51) Int. Cl.
| G11C 8/08 | (2006.01) |
| G11C 16/08 | (2006.01) |
| H03K 19/0175 | (2006.01) |
| G11C 8/10 | (2006.01) |

(52) U.S. Cl.
CPC .......... *G11C 16/08* (2013.01); *G11C 8/08* (2013.01); *G11C 8/10* (2013.01); *H03K 19/017509* (2013.01)

(58) Field of Classification Search
CPC ........................................................ G11C 8/08
USPC ............................................ 365/185.23, 230.06
See application file for complete search history.

(56) References Cited

U.S. PATENT DOCUMENTS

| 5,801,991 | A | 9/1998 | Keeney et al. |
| 6,826,081 | B2 | 11/2004 | Nagashima et al. |
| 6,906,940 | B1 | 6/2005 | Lue |
| 7,227,783 | B2 | 6/2007 | Li |
| 7,315,474 | B2 | 1/2008 | Lue |
| 7,433,235 | B2 | 10/2008 | Chae et al. |
| 7,453,729 | B2 | 11/2008 | Lee |
| 7,742,338 | B2 | 6/2010 | Santin et al. |
| 8,031,530 | B2 | 10/2011 | Joo |
| 8,106,701 | B1 | 1/2012 | Huynh et al. |
| 8,289,775 | B2 | 10/2012 | Lee et al. |
| 8,379,474 | B2 | 2/2013 | Takahashi et al. |
| 8,411,503 | B2 | 4/2013 | Lee |
| 8,503,213 | B2 | 8/2013 | Chen et al. |
| 8,531,229 | B2 | 9/2013 | Shen et al. |
| 8,665,646 | B2 | 3/2014 | Hung et al. |
| 8,723,559 | B2 | 5/2014 | Chen et al. |
| 8,743,624 | B2 | 6/2014 | Lutze et al. |

(Continued)

FOREIGN PATENT DOCUMENTS

WO   2013052329 A1   4/2013

OTHER PUBLICATIONS

Johnson M. et al., "512-Mb PROM With a Three-Dimensional Array of Diodel Antifuse Memory Cells," IEEE Journ. Solid-State Circuits 83(11), Nov. 2003, pp. 1920-1928.

(Continued)

*Primary Examiner* — Son Mai
(74) *Attorney, Agent, or Firm* — Haynes Beffel & Wolfeld LLP

(57) ABSTRACT

A level shifter receiving an input with a relatively narrow voltage range and provides an output with a relatively wide voltage range. The level shifter including a transistor with a turn-on voltage. Control circuitry applies a bias to the level shifter such that the transistor does not receive the turn-on voltage.

19 Claims, 22 Drawing Sheets

(56) References Cited

U.S. PATENT DOCUMENTS

| | | | |
|---|---|---|---|
| 8,760,928 B2 | 6/2014 | Chen et al. | |
| 8,976,600 B2 | 3/2015 | Hung et al. | |
| 2007/0096796 A1* | 5/2007 | Firmansyah | H02M 3/07 327/536 |
| 2008/0315918 A1* | 12/2008 | Luo | H03K 19/09441 326/80 |
| 2010/0019806 A1* | 1/2010 | Bien | G05F 3/262 327/108 |
| 2010/0033226 A1* | 2/2010 | Kim | H03K 19/0185 327/333 |
| 2010/0066420 A1* | 3/2010 | Kaneko | H03L 7/0896 327/157 |
| 2010/0270593 A1 | 10/2010 | Lung et al. | |
| 2011/0116309 A1 | 5/2011 | Lung | |
| 2011/0205218 A1* | 8/2011 | Tsuchi | G09G 3/3283 345/212 |
| 2011/0235398 A1 | 9/2011 | Hosono | |
| 2011/0235408 A1 | 9/2011 | Minemura et al. | |
| 2011/0273940 A1* | 11/2011 | Tanzawa | H03K 19/01852 365/189.11 |
| 2011/0305088 A1 | 12/2011 | Huang et al. | |
| 2012/0007167 A1 | 1/2012 | Hung et al. | |
| 2012/0163087 A1* | 6/2012 | Hung | G11C 8/10 365/185.18 |
| 2012/0182802 A1 | 7/2012 | Hung et al. | |
| 2012/0230111 A1 | 9/2012 | Tanzawa | |
| 2013/0088920 A1 | 4/2013 | Huang et al. | |
| 2013/0215687 A1* | 8/2013 | Chen | G11C 29/021 365/189.11 |
| 2014/0198576 A1 | 7/2014 | Hung et al. | |

OTHER PUBLICATIONS

Jung S-M et al., "Three Dimensionally Stacked NAND Flash Memory Technology Using Stacking Single Crystal Si Layers on ILD and TANOS Structure for Beyond 30 nnm Node," IEEE Int'l Electron Devices Meeting, Dec. 2006, 4pp.

Lai E-K et al., "A Multi-Layer Stackable Thin-Film Transistor (TFT) NAND-Type Flash Memory," IEEE Int'l Electron Devices Meeting, Dec. 2006, 4pp.

Paul B.C. et al., "Impact of a Process Variation on Nanowire and Nanotube Device Performance," IEEE Transactions on Electron Devices 54: Sep. 9, 2007, pp. 2369-2376.

Wang H-H et al., "A New Read-Disturb Failure Mechanism Caused by Boosting Hot-Carrier Injection Effect in MLC NAND Flash Memory," IEEE International Memory Workshop, 2009, May 10-14, 2009, pp. 1-2.

* cited by examiner

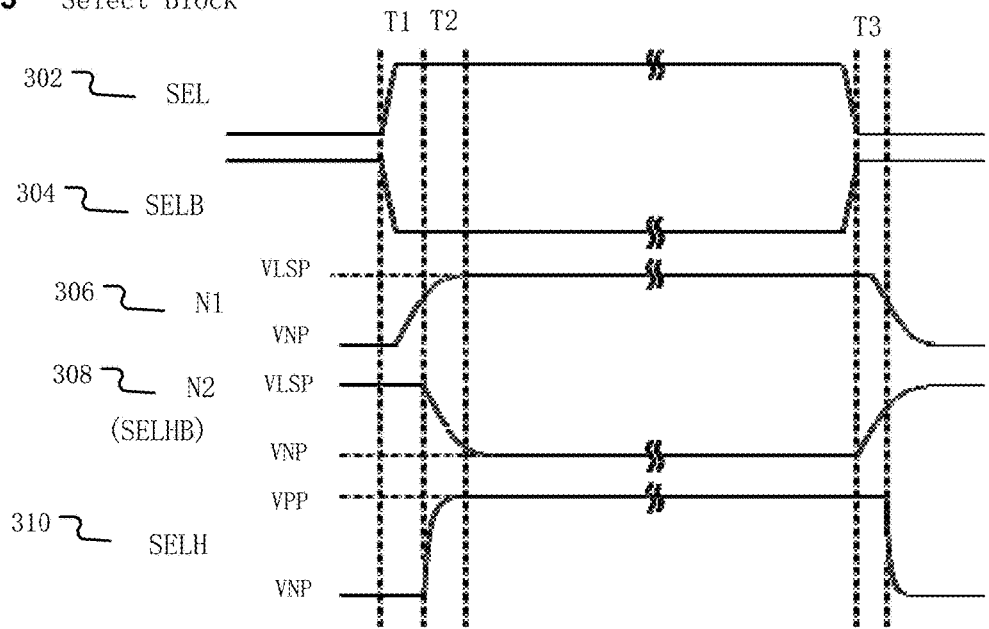
Fig. 3  Select Block
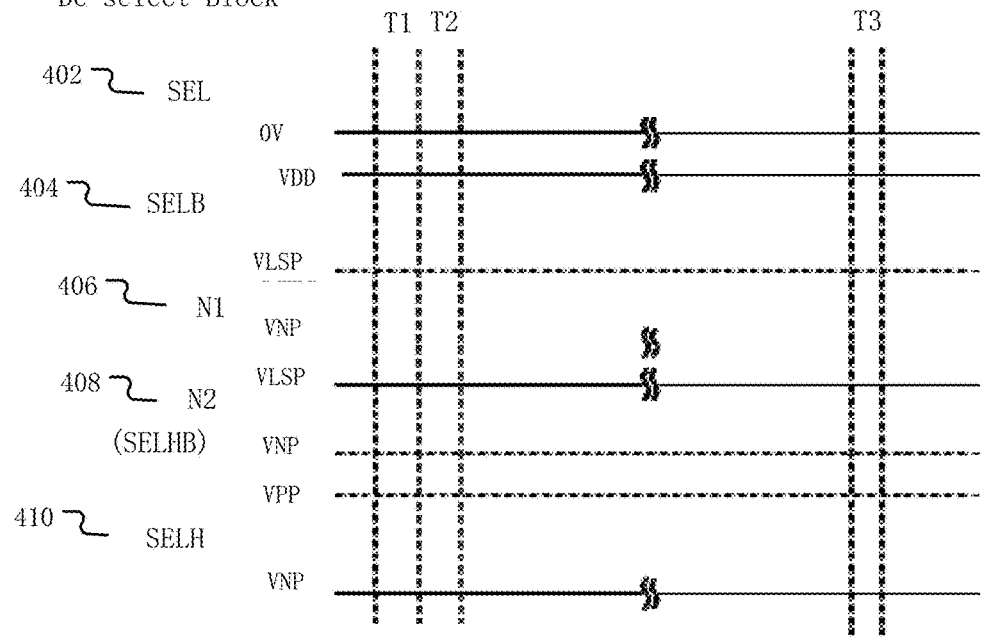
Fig. 4  De-select Block

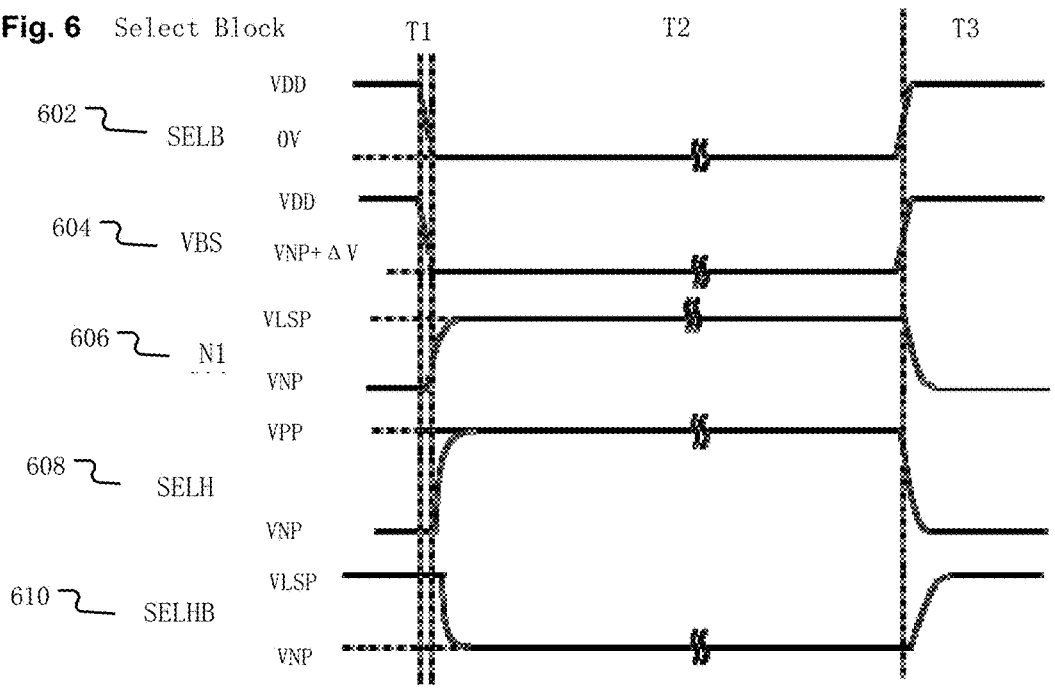
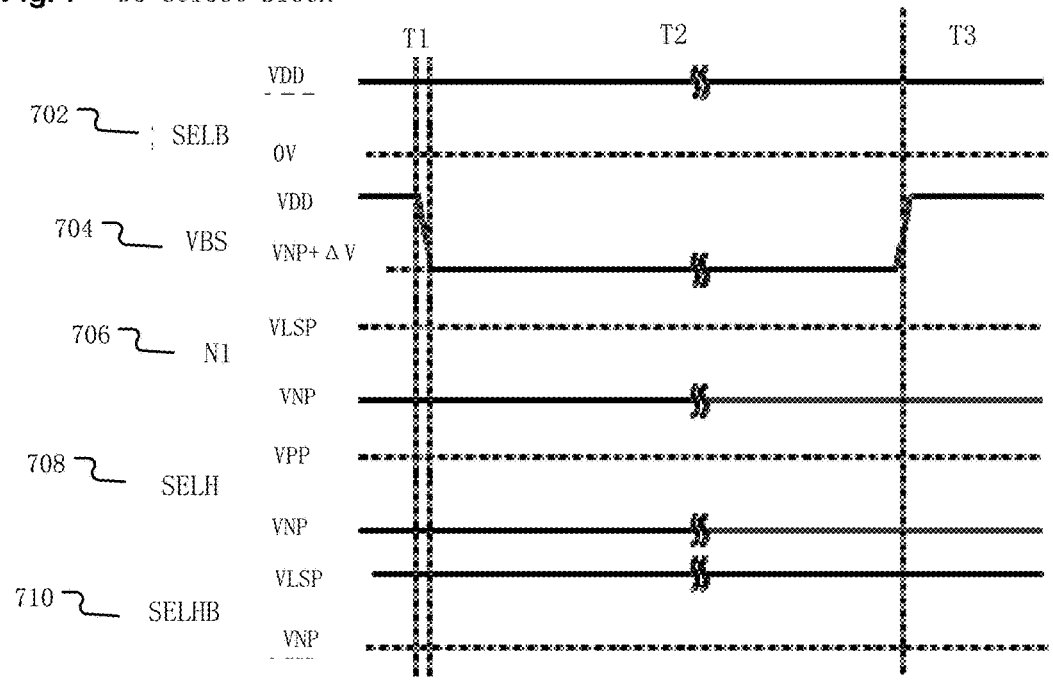

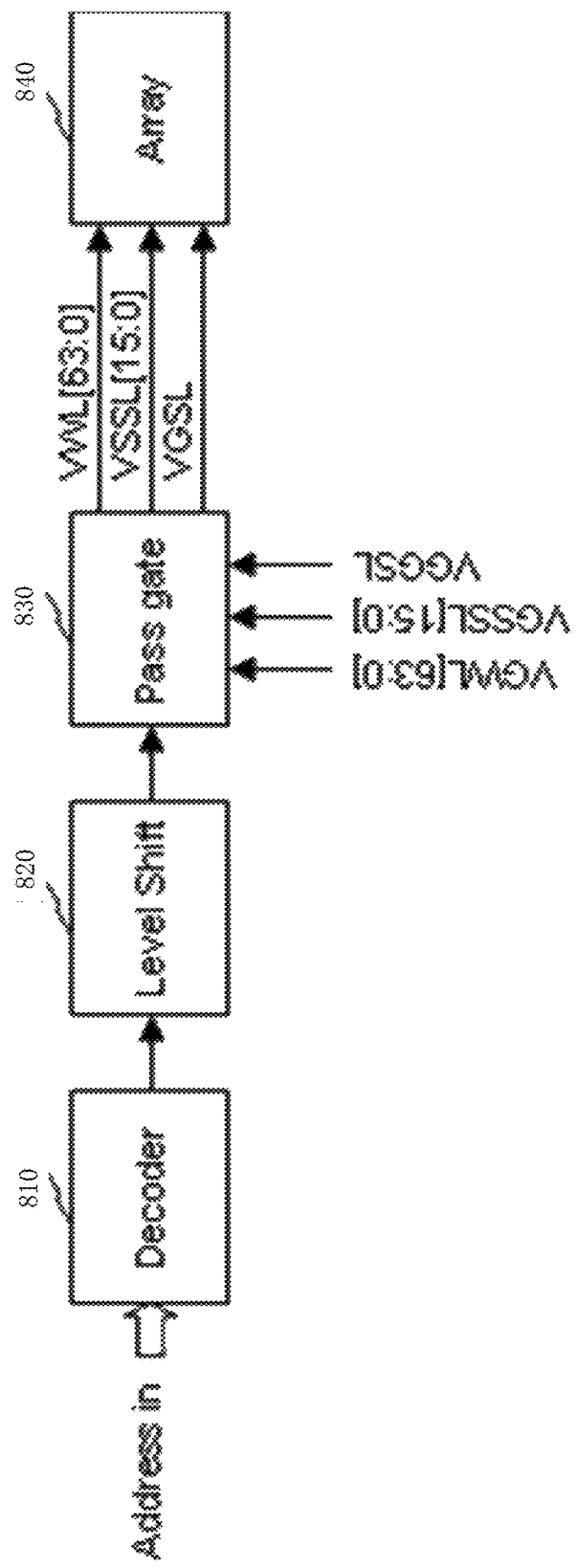

Select Block

Select Block

De-select Block

LEVEL SHIFTER AND DECODER FOR MEMORY

BACKGROUND

Field of the Invention

This technology relates to a level shifter which can be incorporated into a decoder for a NAND memory array.

Description of Related Art

With large capacity NAND flash designs, word lines of sufficient length to accommodate all the memory cells in the array have unacceptable capacitive loading. So the memory array is divided into multiple partitions with discretely decoded sets of word lines, such that the word lines in a partition have a lower, acceptable capacitive loading. The multiple decoders each include p-type and n-type transistors in series between a high voltage reference such as VDD and a low voltage reference such as ground or a negative voltage reference. FIG. 1 shows a large capacity memory divided into multiple partitions with respective word line decoders. The large capacity memory is divided into memory arrays or partitions 121, 122, and 123. The multiple memory arrays or partitions are accessed by respective word line decoders 111, 112, 113, 114, and 115. Because of the quantity of decoders in large capacity memories, the power performance of decoders has a significant impact on overall power performance.

Dynamic power consumption rises during switching actions of the p-type and n-type transistors in series between a high voltage reference such as VDD and a low voltage reference such as ground or a negative voltage reference. Example switching actions are from the p-type transistor being on and the n-type transistor being off, to the p-type transistor being off and the n-type transistor being on, and vice versa. During such switching actions, crossbar current flows directly between the high and low voltage references, through both the p-type transistor and the n-type transistor. Such crossbar current is a significant component of dynamic power consumption in the decoders.

U.S. Pat. No. 8,638,618 shows example decoders with level shifters that suffer from high levels of crossbar current flow during switching actions. FIG. 2 shows a level shifter with relatively high crossbar current, which can be used in a row decoder for a NAND flash memory. The level shifter includes stages 210, 220, and 230. Stage 210 includes voltage supply VDD and negative voltage supply VNP. Stage 210 includes two sets of p-type and n-type transistors coupled in series between VDD and VNP, with the drains coupled together, the source of the p-type transistor coupled to VDD, and the source of the n-type transistor coupled to VNP. The first set includes p-type transistor 211 and n-type transistor 213, where the drains are coupled to node N1. The second set includes p-type transistor 212 and n-type transistor 214, where the drains are coupled to node N2. The gate of n-type transistor 213 is coupled to node N2. The gate of n-type transistor 214 is coupled to node N1. Select signal SEL is received by the gate of p-type transistor 212 and its complement signal SELB is received by the gate of p-type transistor 211.

Stage 220 includes an inverter having an input coupled to node N2 and an output coupled to node N3.

Stage 230 has a positive voltage supply VPP with a higher magnitude than VDD in stage 210. Stage 230 includes an n-type pass transistor 231 having a gate coupled to VDD, and source and drain coupled to node N3 and output node generating signal SELH. Stage 230 also includes n-type depletion mode transistor 233 and p-type transistor 232 coupled in series between VPP and the output node generating signal SELH, where the drain of n-type depletion mode transistor 233 is coupled to VPP and the drain of p-type transistor 232 is coupled to the output node generating signal SELH, and the sources are coupled together. A gate of the drain of n-type depletion mode transistor 233 is coupled to the output node generating signal SELH. A gate of p-type transistor 232 receives signal SELB which is the complement of select signal SEL. Stage 230 also passes signal SELHB from node N2.

FIG. 3 shows voltage traces of the level shifter in FIG. 2, processing select block signals. The voltage traces include SEL 302, SELB 304, N1 306, N2 308, and SELH 310. FIG. 4 shows voltage traces of the level shifter in FIG. 2, processing de-select block signals. The voltage traces include SEL 402, SELB 404, N1 406, N2 408, and SELH 410.

In FIG. 3, during period T1, N2 308 is high at VLSP, and n-type transistor 213 is on due to N2 308 on the gate. During period T2, N2 308 falls from VLSP to VNP. During period T2 while the difference between N2 308 and VNP exceeds the turn-on voltage of n-type transistor 213, n-type transistor 213 is still fully on.

During period T1, SELB 304 changes from high to low. After SELB 304 changes to low during period T1, and while SELB 304 remains low during period T2, p-type transistor 211 is on due to SELB 304 on the gate.

Accordingly, during much of periods T1 and T2, both p-type transistor 211 and n-type transistor 213 are on, such that crossbar current flows between VDD and VNP. Such crossbar current occurs each time that a word line decoder selects a word line in each partition of a memory. It would be desirable to perform level shifting with reduced levels of crossbar current.

SUMMARY

One aspect of the technology is an integrated circuit, comprising a level shifter and control circuitry.

The level shifter receives a first input with a first voltage range, and provides a first output with a second voltage range different from the first voltage range, such as wider. The level shifter includes a first transistor with a turn-on voltage having a first magnitude, a control terminal, and a current-carrying terminal. Examples of a control terminal are a gate of an FET and a base of a BJT. Examples of a current-carrying terminal are a source and drain of an FET and a collector and emitter of a BJT.

The control circuit causes the first current-carrying terminal of the first transistor to be coupled to a reference voltage and the control terminal of the first transistor to be coupled to a control voltage. The control voltage is greater than the reference voltage. In some embodiments, a nonzero difference between the reference voltage and the control voltage has a second magnitude less than the first magnitude. Consequently, the first transistor is biased to not receive the turn-on voltage.

In one embodiment, the first transistor is a field effect transistor, and the field effect transistor conducts current out of saturation, as a result of control circuitry causing the first transistor to be coupled to the reference voltage and the control voltage.

In one embodiment, the level shifter includes the first transistor and a second transistor coupled in series in between a first positive reference voltage and the reference voltage. The first transistor is n-type, the second transistor is p-type, and the first transistor and the second transistor have drains coupled together. In one embodiment, the control circuitry includes a second mode in which the first transistor receives at least the turn-on voltage across the control terminal and the current-carrying terminal, and the second transistor is turned off.

In one embodiment, the first voltage range has a first range maximum and a first range minimum, the second voltage range has a second range maximum and a second range minimum, the second range maximum being greater than the first range maximum, the second range minimum being less than the first range minimum, In one embodiment, the first input of the level shifter is a decoder signal and the first output of the level shifter is coupled to a pass transistor of a word line of a memory array.

In one embodiment, the first input of the level shifter is a decoder signal and the first output of the level shifter is coupled to a pass transistor of a string select line of a memory array.

In one embodiment, the first input of the level shifter is a decoder signal, and wherein the first output of the level shifter is coupled to a pass transistor of a ground select line of a memory array.

In one embodiment, the level shifter includes a plurality of stages.

The first stage provides a first stage voltage output with a first stage voltage range. The first stage voltage range has a first stage minimum and a first stage maximum. The first stage minimum is determined by the reference voltage. The first stage includes the first transistor.

The second stage receives the first stage voltage output. The second stage circuit provides a second stage voltage output with a second stage voltage range wider than the first voltage range. The second stage voltage range has a second stage maximum greater than the first stage maximum. In one embodiment, a block deselect pass transistor is coupled to the level shifter after the first stage and prior to the second stage. One embodiment further comprises at least one intermediate inverter stage in between the first and second stages. In one embodiment, the second stage includes a first n-type transistor coupled in series with a first p-type transistor. The first n-type transistor and the first p-type transistor have sources coupled together. The second stage voltage output is coupled to a gate of the first n-type transistor and a drain of the first p-type transistor. The first n-type transistor has a drain coupled to a positive voltage reference determining the second stage maximum.

Another aspect of the technology is a method, comprising:
providing to the level shifter a first input with a first voltage range, the level shifter providing a first output with a second voltage range different from the first voltage range (for example wider), the level shifter including a first transistor with, the first transistor having a control terminal and a current-carrying terminal, the n-type transistor having a turn-on voltage with a first magnitude; and
at least partly during said providing, applying a bias arrangement to the n-type transistor in the level shifter, the bias arrangement including a reference voltage coupled to the first current-carrying terminal of the first transistor and a control voltage coupled to the control terminal of the first transistor, the control voltage being greater than the reference voltage. In some embodiments a nonzero difference between the reference voltage and the control voltage has a second magnitude less than the first magnitude.

Another aspect of the technology is an integrated circuit with a NAND memory array divided into a plurality of NAND sub-arrays, a plurality of word lines divided across the plurality of NAND sub-arrays, and a plurality of decoders accessing the plurality of NAND sub-arrays. Decoders in the plurality include a level shifter as disclosed herein. The integrated circuit includes control circuitry as disclosed herein.

Various embodiments are disclosed herein.

BRIEF DESCRIPTION OF THE DRAWINGS

FIG. 3 shows voltage traces of the level shifter in FIG. 2, processing select block signals.

FIG. 4 shows voltage traces of the level shifter in FIG. 2, processing de-select block signals.

FIG. 6 shows voltage traces of the level shifter in FIG. 5, processing select block signals.

FIG. 7 shows voltage traces of the level shifter in FIG. 5, processing de-select block signals.

FIG. 8 shows a block diagram of part of an integrated circuit with a memory array, including the level shifter of FIG. 5.

DETAILED DESCRIPTION

Figure 5:
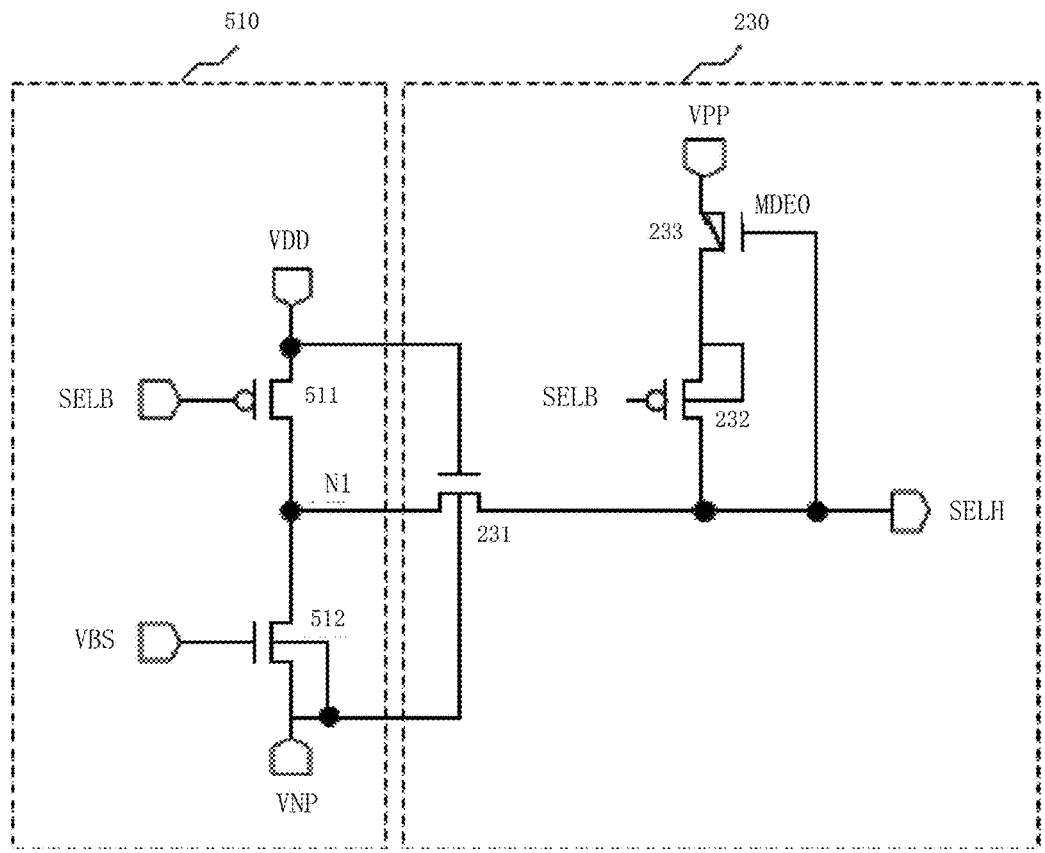
FIG. 5 shows a level shifter with relatively low crossbar current, which can be used in a row decoder for a NAND flash memory.

FIG. 5 shows a level shifter with relatively low crossbar current, which can be used in a row decoder for a NAND flash memory.

The level shifter includes stages 510 and 230. Stage 510 includes voltage supply VDD and negative voltage supply VNP (which in other embodiments is a ground). Stage 510 includes one set of p-type and n-type transistors coupled in series between VDD and VNP, with the drains coupled together, the source of the p-type transistor coupled to VDD, and the source of the n-type transistor coupled to VNP. The first set includes p-type transistor 511 and n-type transistor 512, where the drains are coupled to node N1. Complement signal SELB is received by the gate of p-type transistor 511. Signal VBS is received by the gate of transistor n-type transistor 512. As explained in connection with FIG. 6, signal VBS has a value that decreases crossbar current between VDD and VNP through p-type transistor 511 and n-type transistor 512.

Stage 510 can widen the voltage range from the input voltage range to the output voltage range. The input voltage range is typically a range including voltages representing logical on and logical off, such as VDD and ground. In cases that VNP is lower than the bottom of the input voltage range, the bottom end of the output voltage range is widened to include VNP.

Later stage 230 is similar to FIG. 2. Stage 230 widens the voltage range, from the input voltage range of VDD to VNP, to the output voltage range of VPP to VNP, where VPP>VDD.

FIG. 6 shows voltage traces of the level shifter in FIG. 5, processing select block signals. The voltage traces include SELB 602, VBS 604, N1 606, SELH 608, and SELHB 610.

FIG. 7 shows voltage traces of the level shifter in FIG. 5, processing de-select block signals. The voltage traces include SELB 702, VBS 704, N1 706, SELH 708, and SELHB 710.

In FIG. 6, during period T1, SELB 602 changes from high to low. Prior to period T1, SELB is high and p-type transistor 511 is off due to SELB 602 on the gate. During period T2, while SELB 602 remains low, p-type transistor 211 is on due to SELB 602 on the gate.

Because of the sharp voltage transition during period T1 of SELB 602 from VDD to 0, p-type transistor 511 is on for a brief period during period T1. P-type transistor 511 does not fully conduct during the earlier part of the period T1 while less than a turn-on voltage is applied to p-type transistor 511. P-type transistor 511 only conducts during the later part of period T1 while a turn-on voltage is applied to p-type transistor 511.

Prior to period T1, VBS 604 is at VDD and n-type transistor 512 is on. During period T1, VBS 604 changes from VDD to VNP+delta V. When VBS 604 is at VNP+delta V, the gate-to-source voltage of n-type transistor 512 has a magnitude of delta V. The biasing circuitry is designed such that delta V is less than the turn-on voltage of n-type transistor 512. Because the n-type transistor 512 is not biased with a turn-on voltage (threshold voltage), n-type transistor weakly conducts in the linear region, outside of the saturation region of a transistor.

During period T2, p-type transistor 511 is on, and n-type transistor 512 is weakly on. The weakly on n-type transistor 512 which results from a low magnitude delta V, is preferable to crossbar current with fully on n-type transistor 512. However, if delta V is too small, then SELH does not discharge to VNP in the case of a de-selected block.

The energy consumption with a crossbar current configuration can be represented as: (VDD−VNP)*Crossbar I*(~T1+~T2 in FIG. 3).

The energy consumption without a crossbar current configuration can be represented as: (VDD−VNP)*minimal I*(T2 in FIG. 6).

The smaller the "minimal I" relative to the "crossbar I", the better the improvement in decreased energy consumption. So the more weakly n-type transistor 512 is on, the better the improvement in decreased energy consumption.

Because of the sharp voltage transition during period T1 of VBS 604 from VDD to VNP+delta V, n-type transistor 512 is fully on for only a brief period during period T1. N-type transistor 512 fully conducts during the majority of period T1, during the earlier part of the period T1 while at least a turn-on voltage is applied to n-type transistor 512. N-type transistor 512 only weakly conducts during the ending part of period T1 while a turn-on voltage is no longer applied to n-type transistor 512.

During period T2, VBS 604 remains at VNP+delta V, such that the n-type transistor continues to conduct only weakly in the linear region.

FIG. 7 shows VBS 704 for level shifters processing de-select block signals, which is the same signal as VBS 604 for level shifters processing select block signals. As with VBS 604 in FIG. 6, the n-type transistor 512 is fully on for only a brief period during period T1, and is biased to conduct only weakly in the linear region during period T2 However, for level shifters processing de-select block signals, SELB 702 remains high throughout, keeping p-type transistor 511 turned off. Because p-type transistor 511 remains turned off, no current flows between VDD and VNP.

Thus, crossbar current between VDD and VNP is minimized in both FIGS. 6 and 7, despite the same signal VBS 604/704 being used in both level shifters processing select block signals, and level shifters processing de-select block signals.

FIG. 8 shows a block diagram of part of an integrated circuit with a memory array, including the level shifter of FIG. 5.

Figure 21:
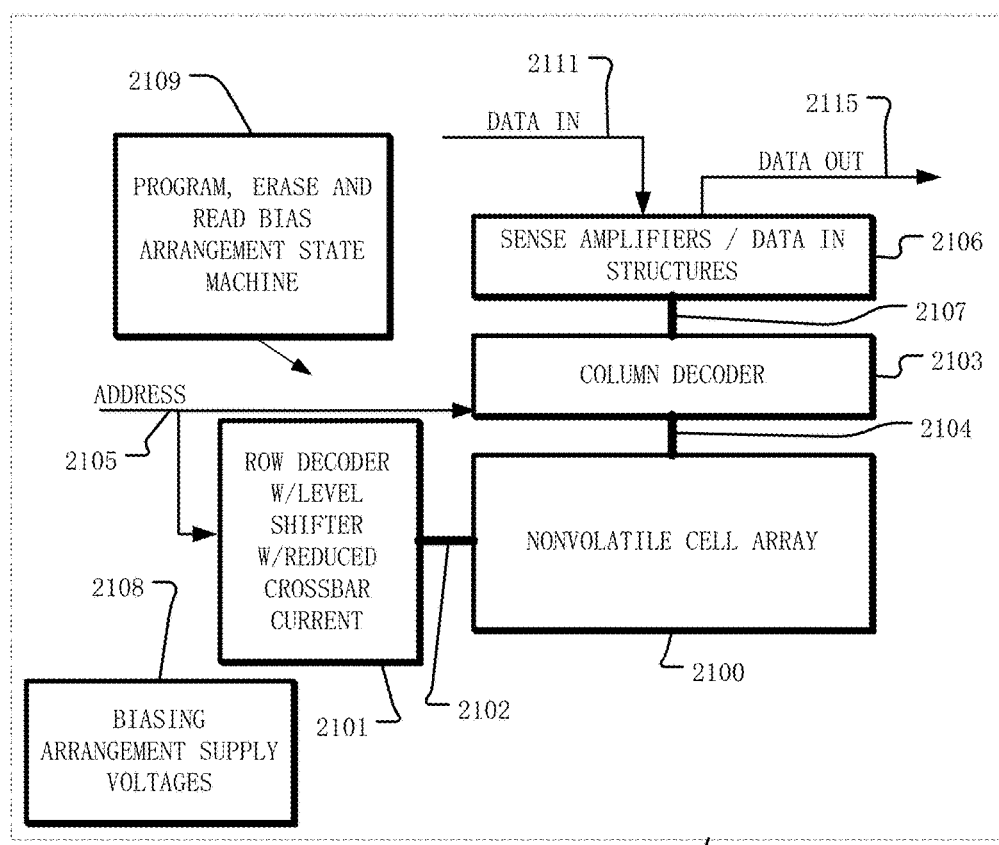
FIG. 21 is a block diagram of the integrated circuit including an array of nonvolatile memory cells, and other circuitry.

Shown are decoder stage 810, level shifter stage 820, pass gate stage 830, and the array 840. The decoder stage 810 processes row address signals to select or de-select blocks or word lines. An example decoder stage 810 is shown in more detail in FIG. 9. The level shifter stage 820 widens the voltage range, for example from a narrow input voltage range adapted for address signals, to a wider output range adapted for passing word line voltages that can be large magnitude positive voltages or larger magnitude negative voltages. An example level shifter stage 820 is shown in more detail in FIGS. 10 and 11. The pass gate stage 830 selects or de-selects blocks or word lines by applying appropriate signals to pass transistors that pass or block word line voltages from reaching word lines in the memory array. An example pass gate stage 830 is shown in more detail in FIG. 12. The memory array stores data, and can be volatile or nonvolatile. An example block diagram of a memory array is shown in FIG. 21.

Figure 9:
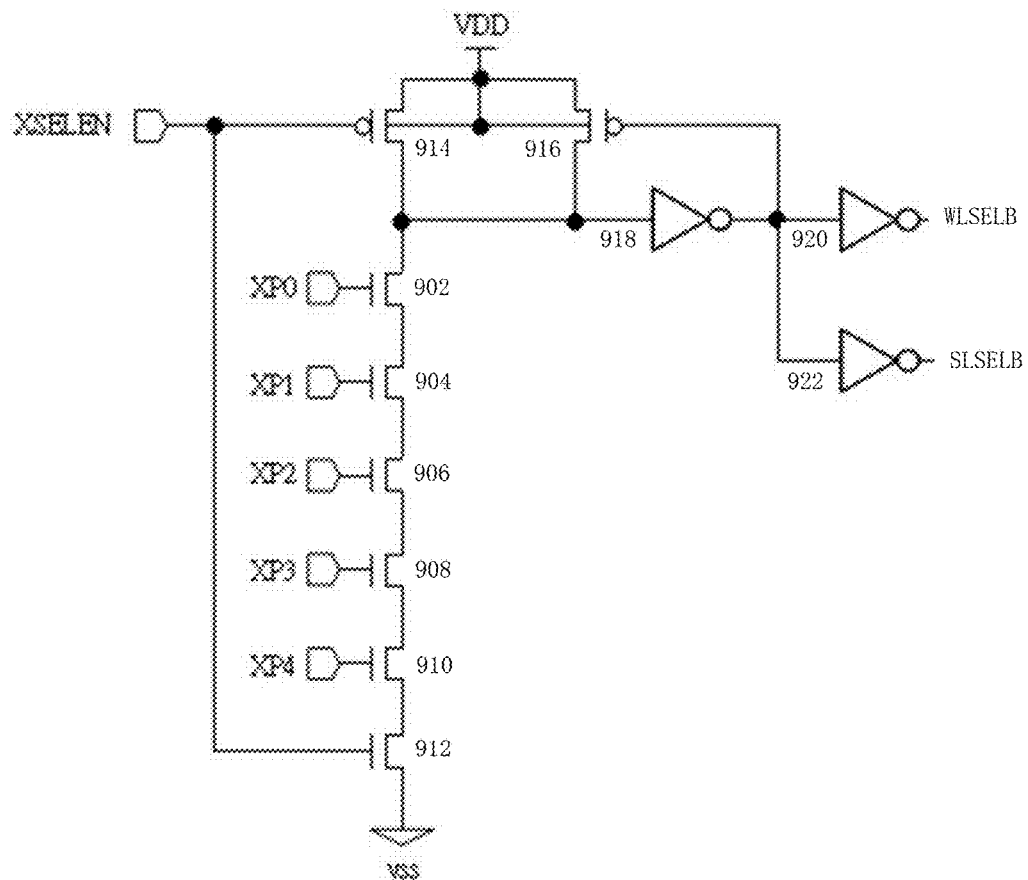
FIG. 9 shows a decoding stage of the block diagram in FIG. 8, sending select and de-select signals to the level shifting stages of FIGS. 10 and 11.
Figure 10:
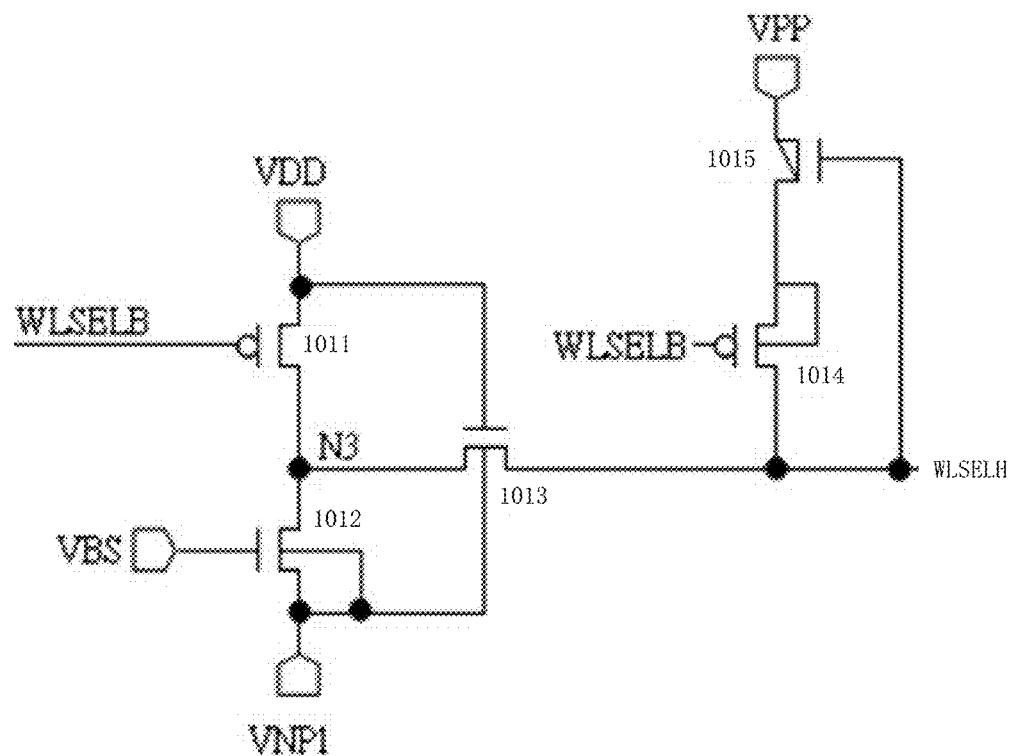
FIG. 10 shows a level shifting stage of the block diagram in FIG. 8 for word line pass transistor signals, incorporating the level shifter of FIG. 5.
Figure 11:
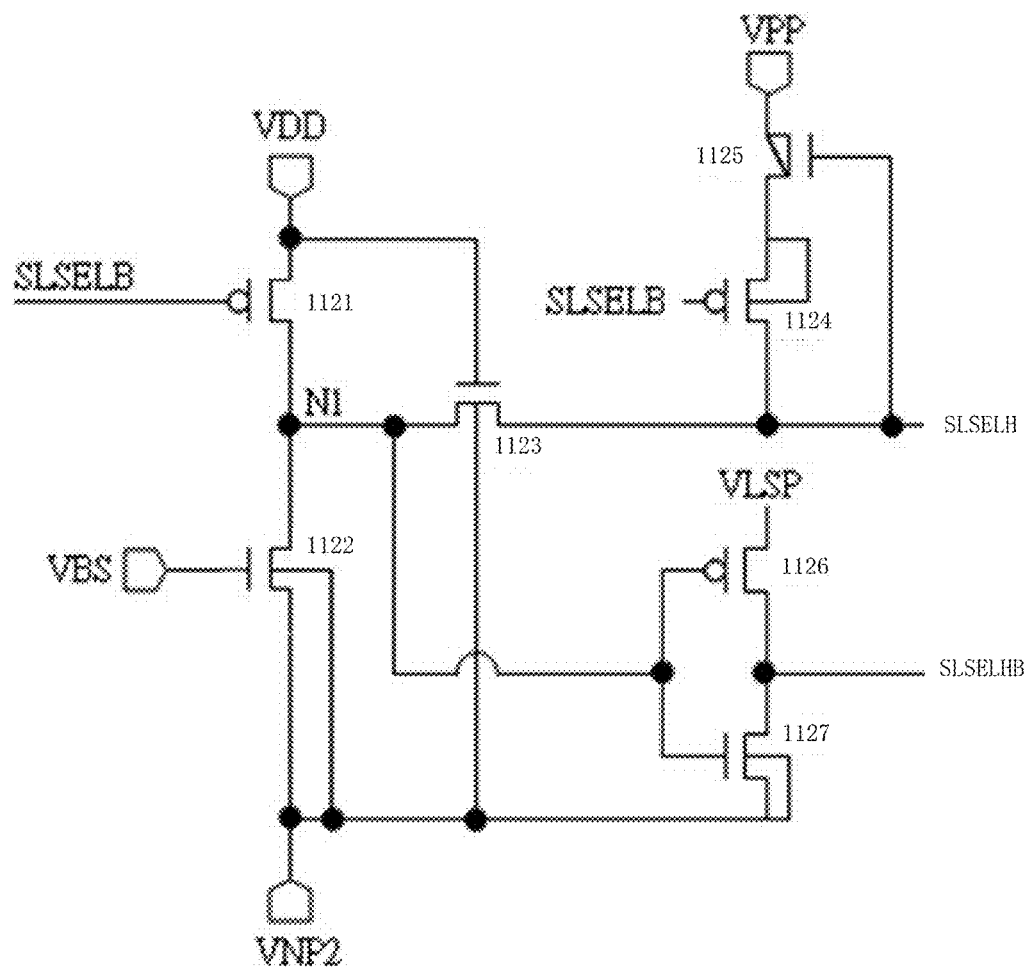
FIG. 11 shows a level shifting stage of the block diagram in FIG. 8 for source line pass transistor signals, incorporating the level shifter of FIG. 5.

FIG. 9 shows a decoding stage of the block diagram in FIG. 8, sending select and de-select signals to the level shifting stages of FIGS. 10 and 11.

The decoding stage receives row address signals XP0, XP1, XP2, XP3, and XP4 which are received by respective NAND transistors 902, 904, 906, 908, and 910. Signal XSELEN is received by NAND transistor 912. Signal XSELEN is received also by the gate of p-type transistor 914. The NAND transistors have one end coupled to VSS, and another end coupled to the input of inverter 918 and to the drains of p-type transistors 914 and 916. P-type transistors 914 and 916 have sources coupled to VDD. The gate of p-type transistor 916 is coupled to the output of inverter 918. The output of inverter 918 is the select signal. The select signal is inverted by inverter 920 generating WLSELB and inverter 922 generating SLSELB.

In response to a high XSELEN signal, and the appropriate row address signals XP0-XP4, output signals WLSELB and SLSELB are low, indicating a selected word line or memory block. In response to a low XSELEN signal, or row address signals XP0-XP4 selecting another word line or memory block (de-selecting this word line or memory block), output signals WLSELB and SLSELB are high, indicating a de-selected word line or memory block.

In the shown decoding stage, two copies of the select or de-select signal are generated. Other embodiments can send one copy, or 3 or more copies, depending on the level shifter, pass transistor, and memory array design.

FIG. 10 shows a level shifting stage of the block diagram in FIG. 8 for word line pass transistor signals, incorporating the level shifter of FIG. 5. Operation is generally similar to FIG. 5.

The level shifter receives signal WLSELB from FIG. 9 at p-type transistors 1011 and 1014, and generates output signal WLSELH. The signal names incorporate WL because the level shifter generates select and de-select signals for pass transistors of word line voltages.

FIG. 11 shows a level shifting stage of the block diagram in FIG. 8 for source line pass transistor signals, incorporating the level shifter of FIG. 5. Operation is generally similar to FIG. 5.

The level shifter receives signal SLSELB from FIG. 9 at p-type transistors 1121 and 1124, and generates output signals SLSELH and SLSELHB. The signal names incorporate SL because the level shifter generates select and de-select signals for pass transistors of string select and ground source line voltages on opposite ends of NAND strings in the memory array.

As with FIG. 5, the level shifter includes multiple stages. A first stage includes p-type transistor 1121 and n-type transistor 1122, and widens the voltage range to VDD to VNP2. A second stage includes p-type transistor 1124 and n-type transistor 1125 and widens the voltage range to VPP to VNP2.

Output signal SLSELH is generated after the second stage. So output signal SLSELH has a voltage range of VPP to VNP2.

Output signal SLSELHB is generated from an inverter after the first stage, not the second stage. So the voltage range of output signal SLSELHB does not include VPP. The inverter includes p-type transistor 1126 and n-type transistor 1127. If node N1 has the voltage VDD, then SLSELHB has the voltage VNP2. If node N1 has the voltage VNP2, then SLSELHB has the voltage VLSP. In one example, VLSP=VDD.

Figure 12:
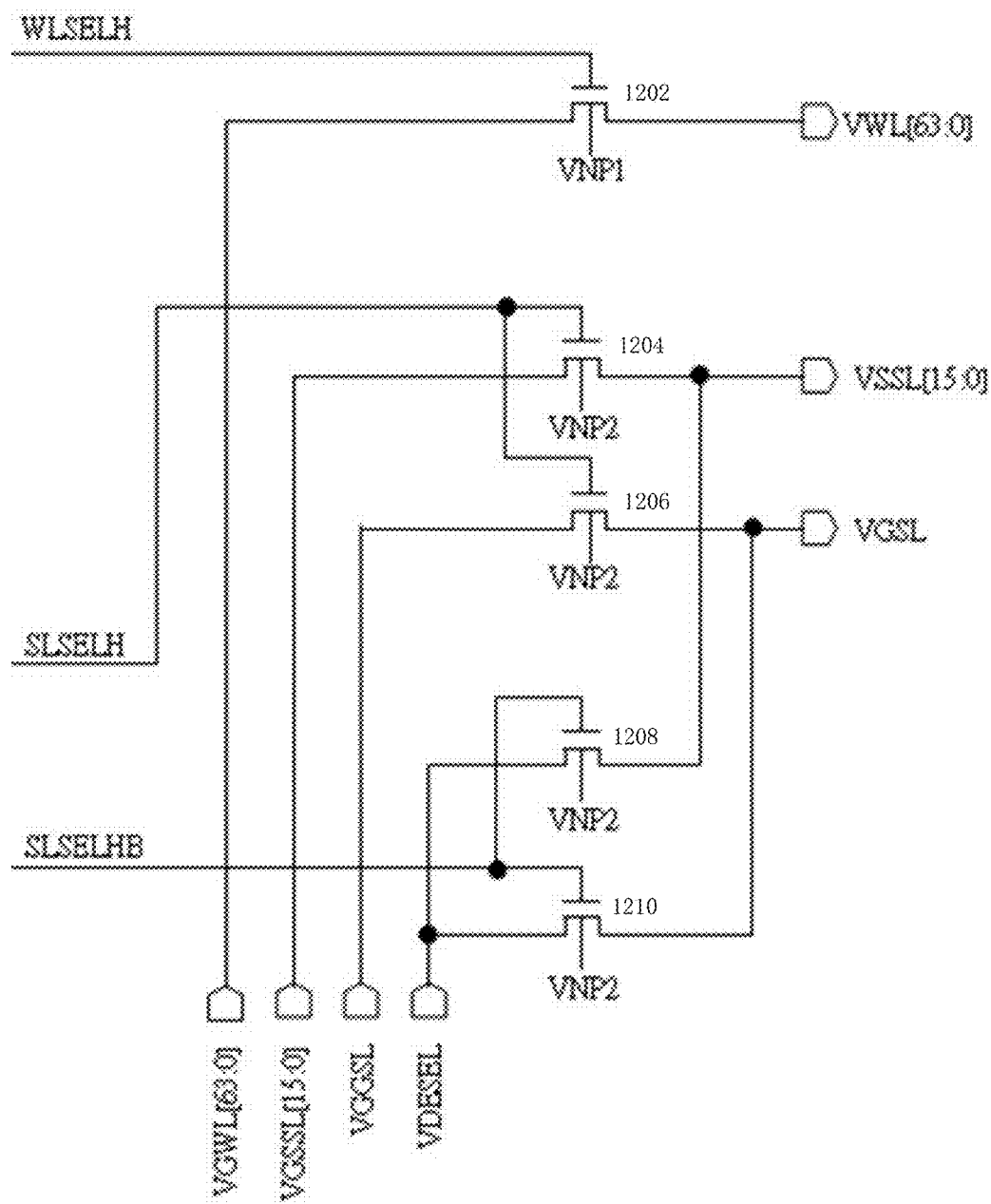
FIG. 12 shows a pass transistor stage of the block diagram in FIG. 8, receiving the pass transistor signals from the level shifting stages of FIGS. 10 and 11.

FIG. 12 shows a pass transistor stage of the block diagram in FIG. 8, receiving the pass transistor signals from the level shifting stages of FIGS. 10 and 11.

Signal WLSELH is received from the output in FIG. 10. Signals SLSELH and SLSELHB are received from the outputs in FIG. 11.

In one case, the word line or memory block is selected. WLSELH is high, turning on pass transistor 1202 and coupling global word line voltages VGWL[63:0] to word lines VWL[63:0]. SLSELH is high, turning on pass transistor 1204 and coupling global string select line voltages VGSSL[15:0] to string select lines VSSL[15:0], and turning on pass transistor 1206 and coupling global ground select line voltage VGGSL to ground select line VGSL. SLSELHB is low, turning off pass transistor 1208 and decoupling VDESEL from string select lines VSSL[15:0], and turning off pass transistor 1210 and decoupling global ground select line voltage VGGSL from ground select line VGSL.

In another case, the word line or memory block is de-selected. WLSELH is low, turning off pass transistor 1202 and decoupling global word line voltages VGWL[63:0] from word lines VWL[63:0]. SLSELH is low, turning off pass transistor 1204 and decoupling global string select line voltages VGSSL[15:0] from string select lines VSSL[15:0], and turning off pass transistor 1206 and decoupling global ground select line voltage VGGSL from ground select line VGSL. SLSELHB is high, turning on pass transistor 1208 and coupling VDESEL to string select lines VSSL[15:0], and turning on pass transistor 1210 and coupling VDESEL to ground select line VGSL.

Other embodiments include a different number of signal types, including more or fewer. For example, VSSL and VGSL may be removed. Other embodiments include a different number of lines of a signal type. For example, there may be more or fewer word lines, and more or fewer string select lines.

Figure 13:
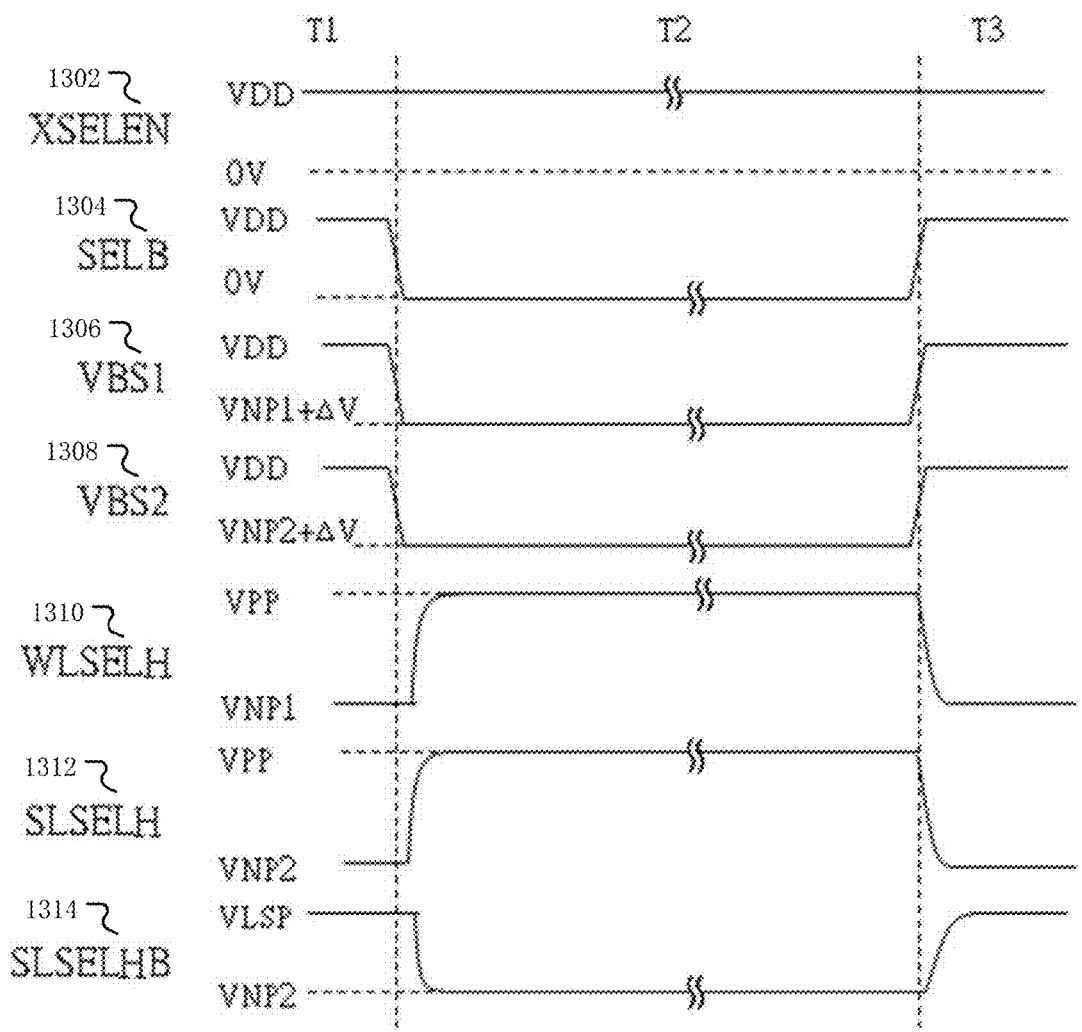
FIG. 13 shows voltage traces of the level shifters in FIGS. 10 and 11, processing select block signals.

FIG. 13 shows voltage traces of the level shifters in FIGS. 10 and 11, processing select block signals. The voltage traces include XSELEN 1302, SELB 1304, VBS1 1306, VBS2 1308, WLSELH 1310, SLSELH 1312, and SLSELHB 1314. Operation is generally similar to FIG. 6.

Figure 14:
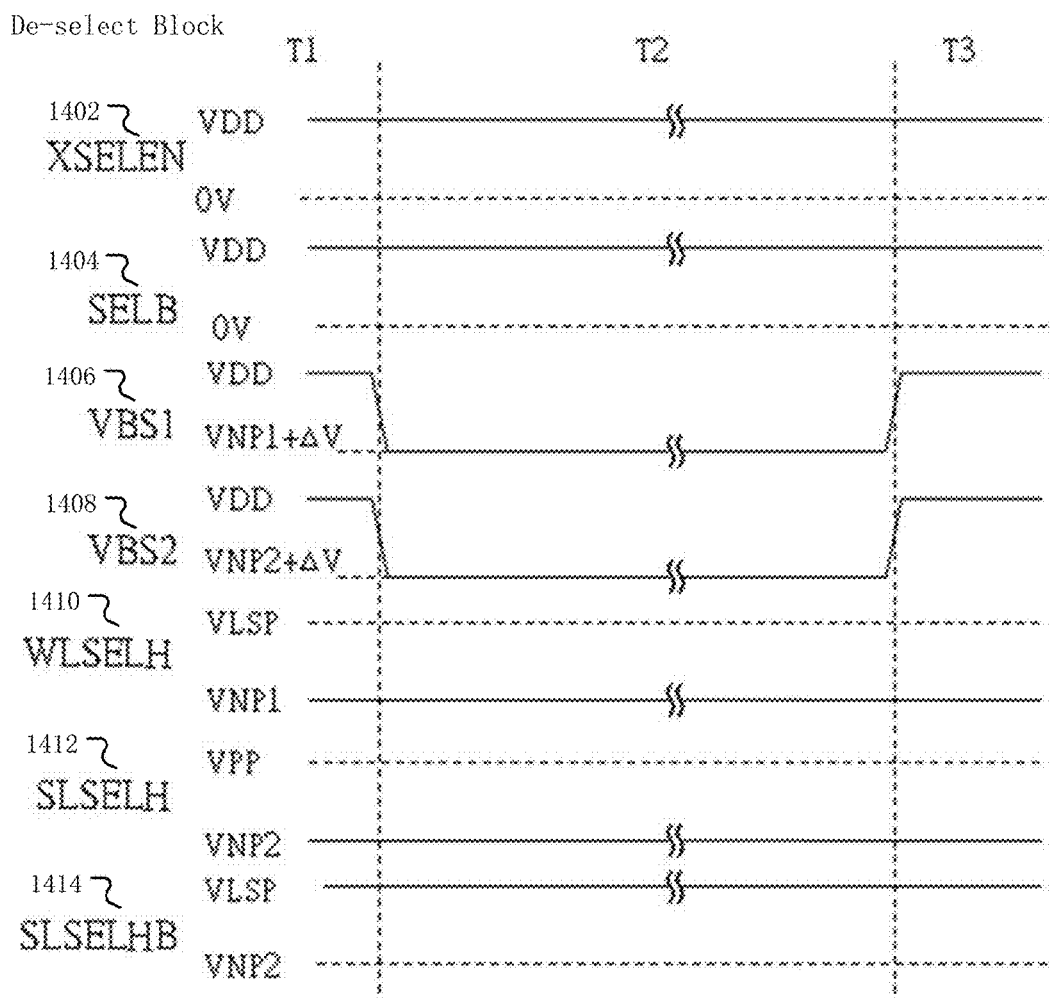
FIG. 14 shows voltage traces of the level shifters in FIGS. 10 and 11, processing de-select block signals.

FIG. 14 shows voltage traces of the level shifters in FIGS. 10 and 11, processing de-select block signals. The voltage traces include XSELEN 1402, SELB 1404, VBS1 1406, VBS2 1408, WLSELH 1410, SLSELH 1412, and SLSELHB 1414. Operation is generally similar to FIG. 7.

FIGS. 13 and 14 differ from FIGS. 6 and 7 by including additional voltage traces. XSELEN 1302/1402 is an enable signal for the decoder of FIG. 9. Instead of a single SELH signal, WLSELH 1310/1410 and SLSELH 1312/1412 are the SELH signals respectively for word lines and string select lines. Instead of a single VBS signal, VBS1 1306/1406 and VBS2 1308/1408 are the VBS signals respectively for the level shifter for word lines in FIG. 10 and for the level shifter for string select lines in FIG. 11.

In one embodiment, VBS1 and VBS2 are copies of the same VBS signal. In another embodiment, delta V is the same in VBS1 and VBS2, but VNP1 and VNP2 are different. In another embodiment, delta V is different in VBS1 and VBS2, but VNP1 and VNP2 are the same. In another embodiment, delta V is different in VBS1 and VBS2, and VNP1 and VNP2 are different. When VNP1 and VNP2 are the same, the same the same negative pump can drive both.

Figure 15:
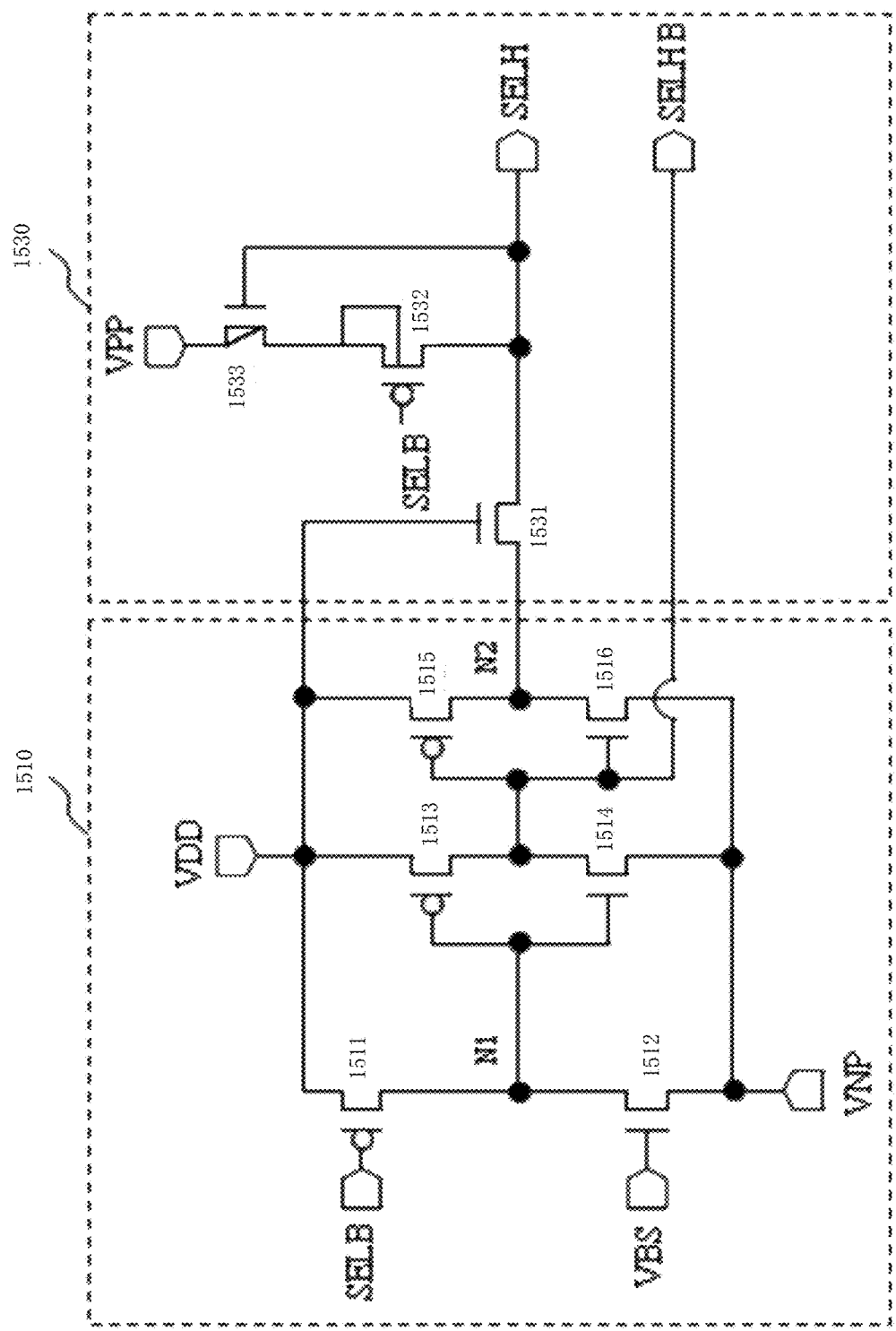
FIG. 15 shows a variation of the level shifter of FIG. 5.

FIG. 15 shows a variation of the level shifter of FIG. 5. Operation is generally similar to FIG. 5.

The level shifter includes stage 1510 with output voltage range of VDD to VNP, and stage 1530 with output voltage range of VPP to VNP. Two inverters are added in between node N1 and pass transistor 1531. A first inverter includes p-type transistor 1513 and n-type transistor 1514. A second inverter includes p-type transistor 1515 and n-type transistor 1516. Output signal SELHB is sent from between the inverters, and is a complement of signal SELH. Because output signal SELHB does not pass through the later stage 1530, output signal SELHB excludes VPP from its voltage range.

Figure 16:
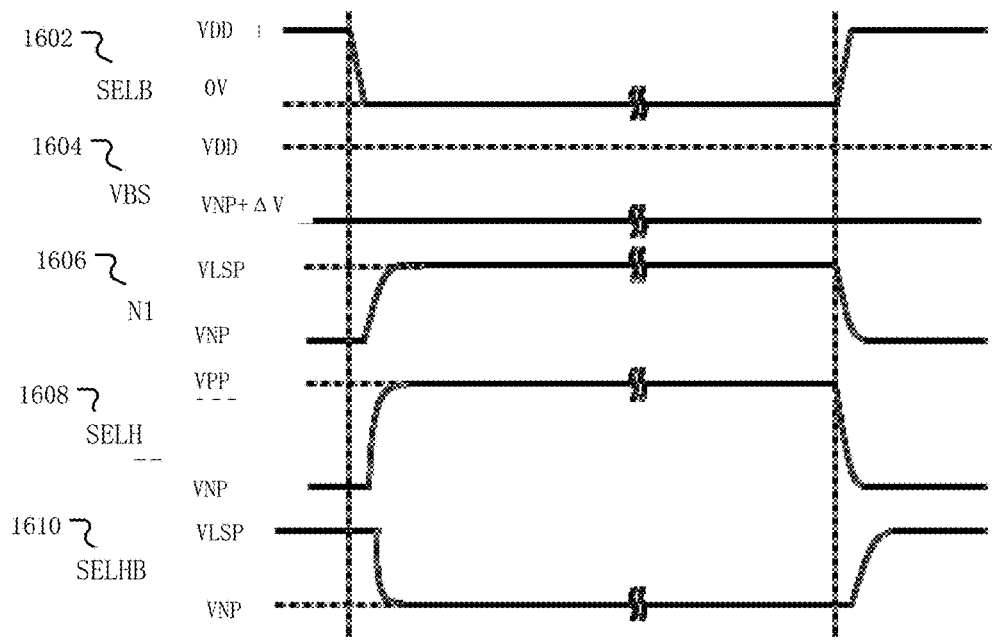
FIG. 16 shows voltage traces of the level shifter in FIG. 15, processing select block signals.

FIG. 16 shows voltage traces of the level shifter in FIG. 15, processing select block signals. The voltage traces include SELB 1602, VBS 1604, N1 1606, SELH 1608, and SELHB 1610. Operation is generally similar to FIG. 6.

Figure 17:
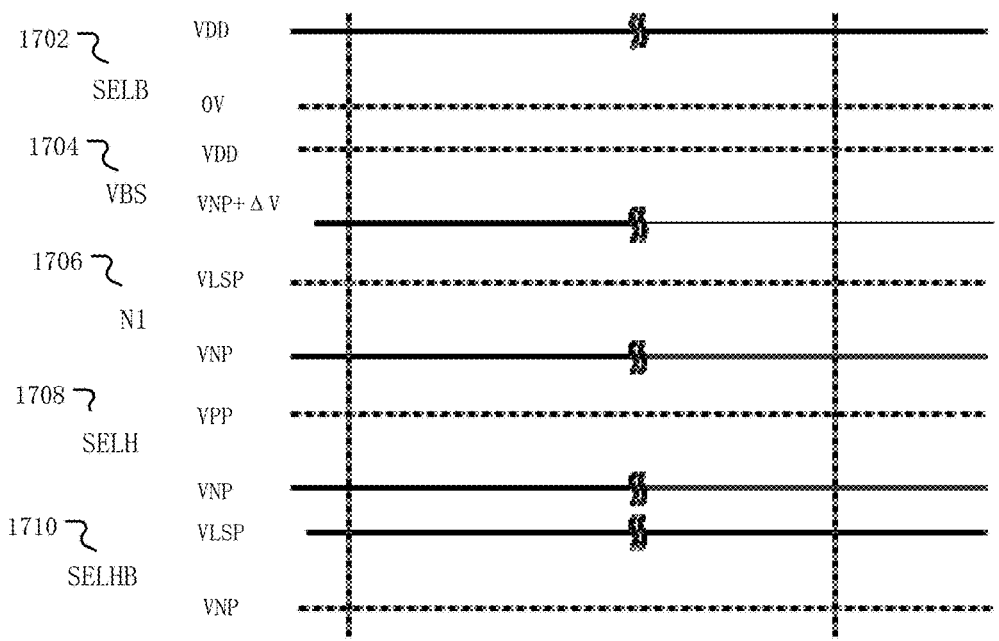
FIG. 17 shows voltage traces of the level shifter in FIG. 15, processing de-select block signals.

FIG. 17 shows voltage traces of the level shifter in FIG. 15, processing de-select block signals. The voltage traces include SELB 1702, VBS 1704, N1 1706, SELH 1708, and SELHB 1710. Operation is generally similar to FIG. 7.

The VBS 604 of FIG. 6 has VDD level prior to period T1 and during period T3, to discharge the SELH 608. Node SELH 608 has heavy loading, such that to quickly discharging SELH 608, VBS 604 goes to VDD. By contrast, in FIGS. 16 and 17, node N1 1606 and 1706 has light loading, such that VBS=VNP+delta V discharges node N1 1606 and 1706, without resorting to VDD. In some embodiments, in FIGS. 7 and 17 VBS 604 can go to VDD.

Figure 18:
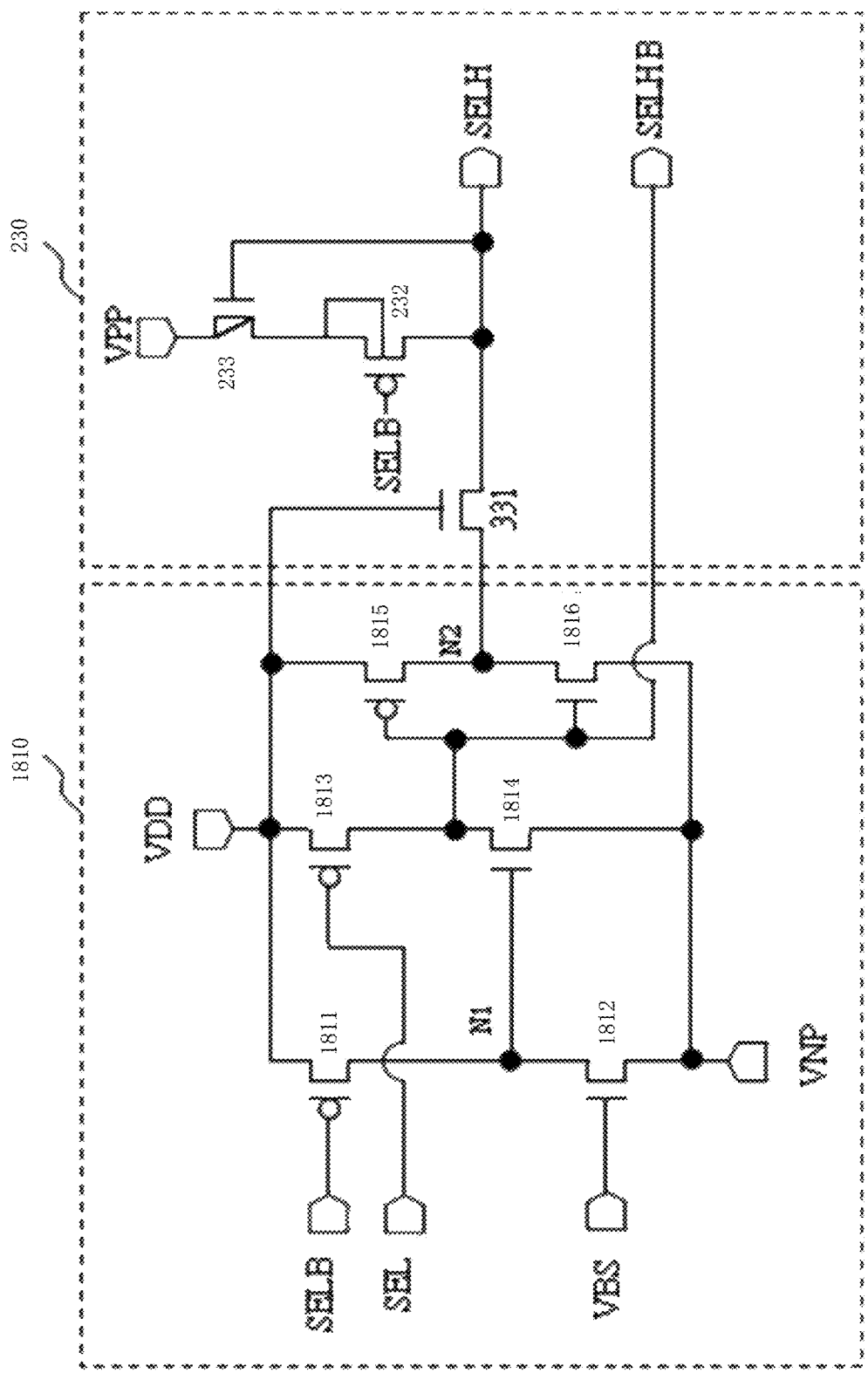
FIG. 18 shows another variation of the level shifter of FIG. 15.

FIG. 18 shows another variation of the level shifter of FIG. 15. Operation is generally similar to FIG. 15. However, the first inverter including p-type transistor 1813 and 1814 is changed. The gate of p-type transistor 1813 is coupled not to node N1, but instead receives signal SEL.

Figure 19:
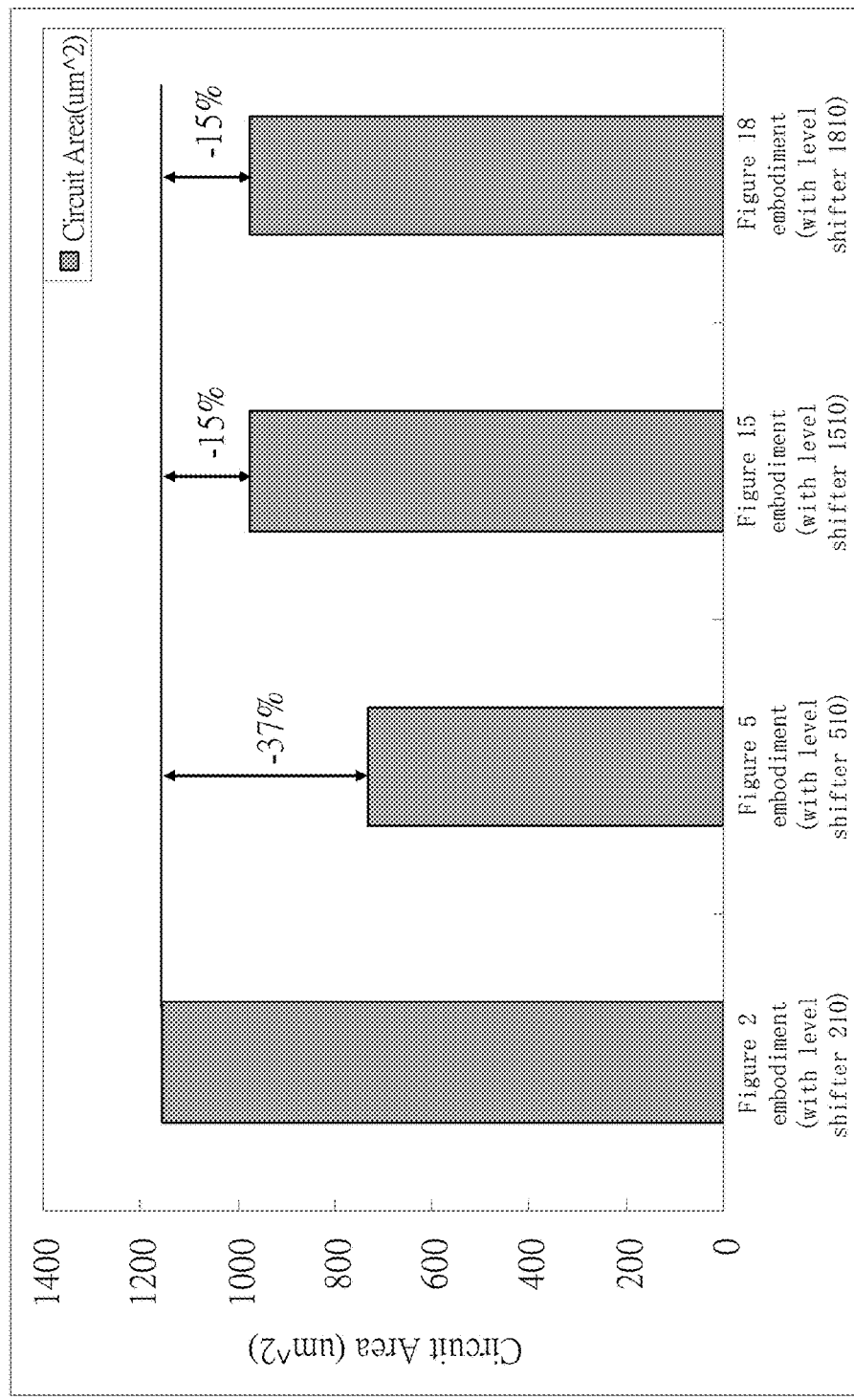
FIG. 19 shows a bar chart of the respective circuit areas of various level shifters.

FIG. 19 shows a bar chart of the respective circuit areas of various level shifters.

Figure 2:
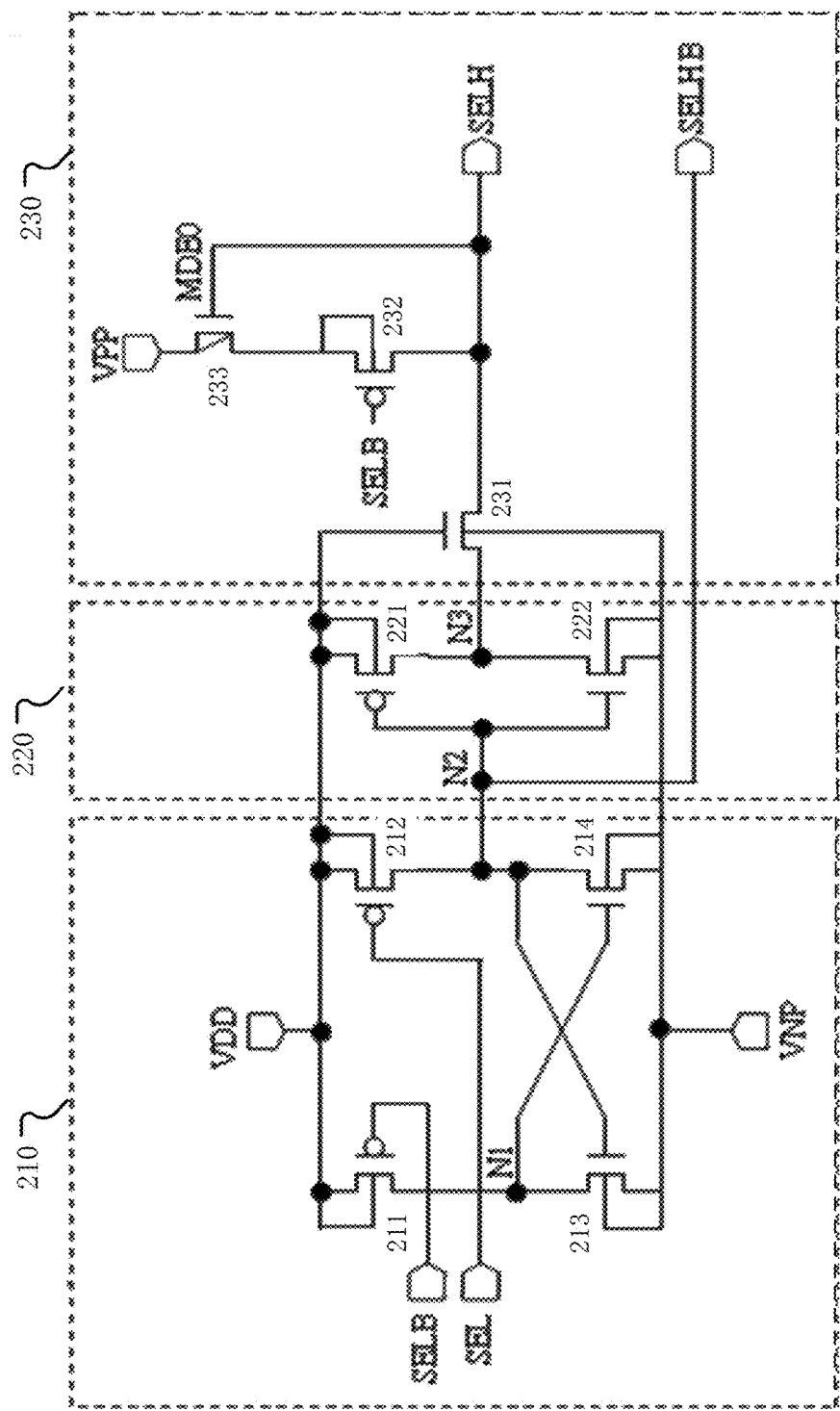
FIG. 2 shows a level shifter with relatively high crossbar current, which can be used in a row decoder for a NAND flash memory.

Shown are areas of the level shifter embodiments of FIG. 2 (level shifter 210), FIG. 5 (level shifter 510), FIG. 15 (level shifter 1510), FIG. 18 (level shifter 1810). The level shifter 210 in FIG. 2 has p-type transistors that are large in order to charge and discharge quickly. The other level shifters do not require large p-type transistors, because the design decreases crossbar current. Level shifter 510 has the smallest area, 37% smaller than level shifter 210, due to the absence of intermediate inverters. Level shifters 1510 and 1710 are larger than level shifter 510 due to the inclusion of intermediate inverters, but are still 15% smaller than level shifter 210.

Figure 20:
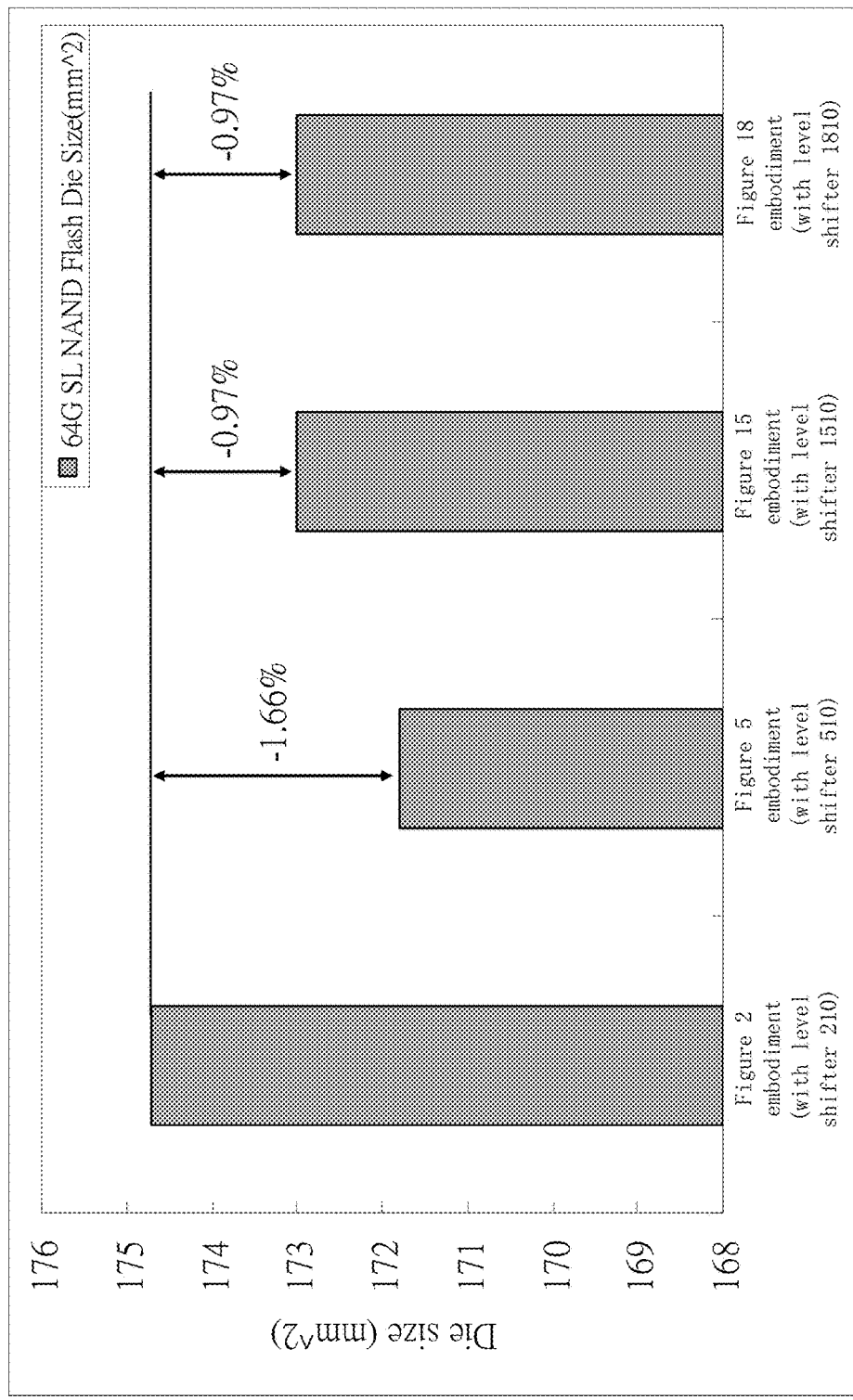
FIG. 20 shows a bar chart of the respective die areas of integrated circuits including various level shifters.

FIG. 20 shows a bar chart of the respective die areas of integrated circuits including various level shifters.

The general ordering of size advantage is the same as in FIG. 19. However, the difference magnitudes are smaller, because the level shifter is only part of the die area of the 64 G SL NAND flash integrated circuit. For example, the decoder, pass transistors, and the memory array are substantially unchanged. Alternative embodiments include MLC (multilevel cells) or other designs with more bits per cell.

FIG. 21 is a block diagram of the integrated circuit including an array of nonvolatile memory cells, and other circuitry.

The integrated circuit 2150 includes a memory array 2100 implemented using NAND memory cells. Addresses are supplied on bus 2105 to column decoder 2103 and row decoder 2101 which includes the improved level shifter circuitry. Sense amplifiers and data-in structures in block 2106 are coupled to the column decoder 2103 via data bus 2107. Data is supplied via the data-in line 2111 from input/output ports on the integrated circuit 2150, or from other data sources internal or external to the integrated circuit 2150, to the data-in structures in block 2106. Data is supplied via the data-out line 2115 from the block 2106 to input/output ports on the integrated circuit 2150, or to other data destinations internal or external to the integrated circuit 2150. The integrated circuit 2150 may also include circuitry directed a mission function other than the nonvolatile storage.

A controller implemented in this example using bias arrangement state machine 2109 controls the application of bias arrangement supply voltages 2108, such as read, program, erase, erase verify and program verify voltages.

The control circuitry has a first mode causing a first current-carrying terminal of a first transistor in the level shifter to be coupled to a reference voltage and the control terminal of the first transistor to be coupled to a control voltage. The control voltage being greater than the reference voltage. The difference between the reference voltage and the control voltage having a second magnitude less than the first magnitude. The control circuitry includes a second mode in which the first transistor receives at least the turn-on voltage across the control terminal and the current-carrying terminal, and the second transistor is turned off, where the second transistor can be a p-type transistor in series with the n-type first transistor in between voltage references.

The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 1:
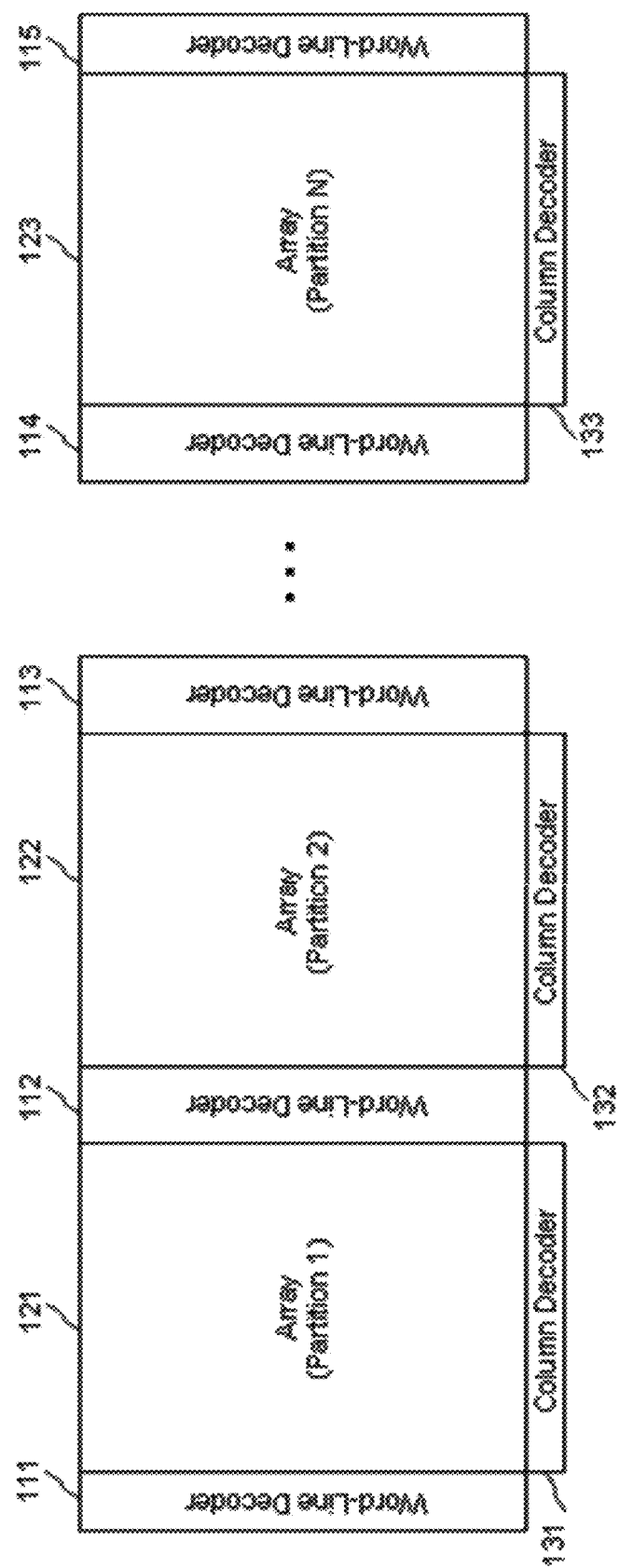
FIG. 1 shows a large capacity memory divided into multiple partitions with respective word line decoders.

The memory array 2100 can be divided into sub-arrays as shown in FIG. 1. The different sub-arrays are accessed by different row decoders 2101. Word lines are divided across the different sub-arrays.

Figure 22:
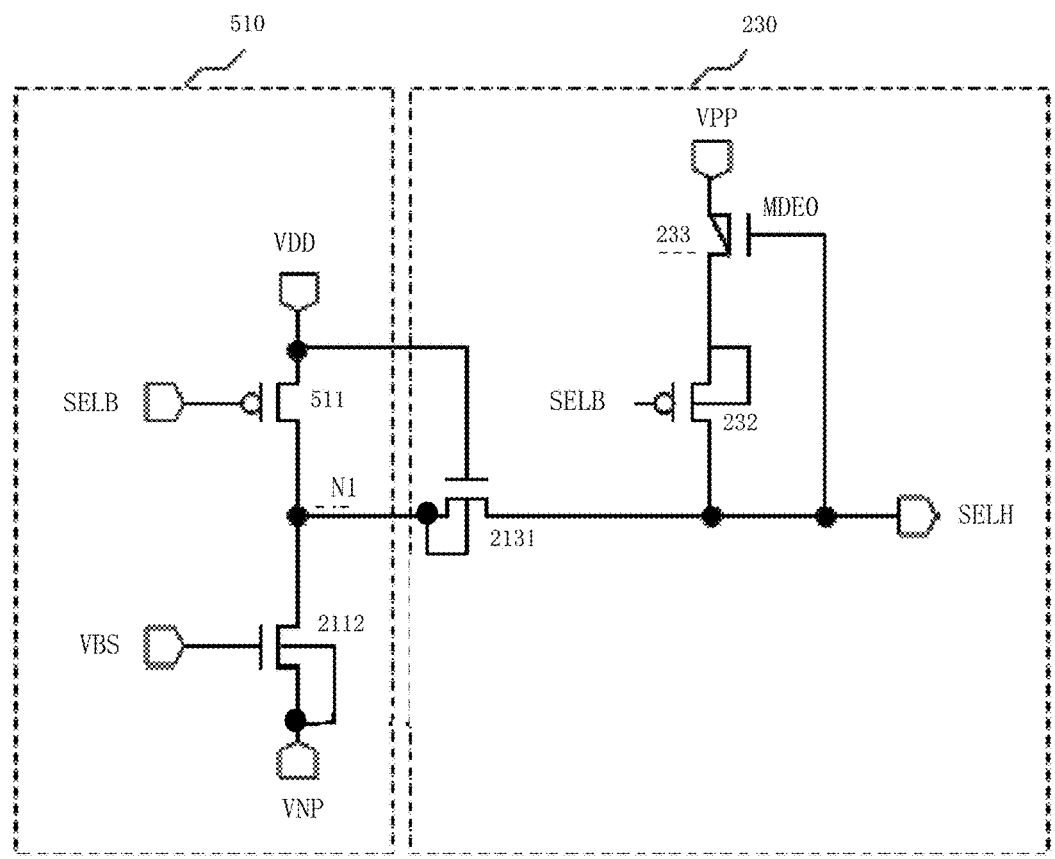
FIG. 22 shows a modified version of the level shifter of FIG. 5 with relatively low crossbar current, which can be used in a row decoder for a NAND flash memory.

FIG. 22 shows a modified version of the level shifter of FIG. 5 with relatively low crossbar current, which can be used in a row decoder for a NAND flash memory.

Operation is generally similar to FIG. 5. However, in stage 230 the n-type pass transistor 2131 has the body connected to the source node. Junction breakdown in the n-type pass transistor 2131 is lessened as a potential issue.

Figure 23:
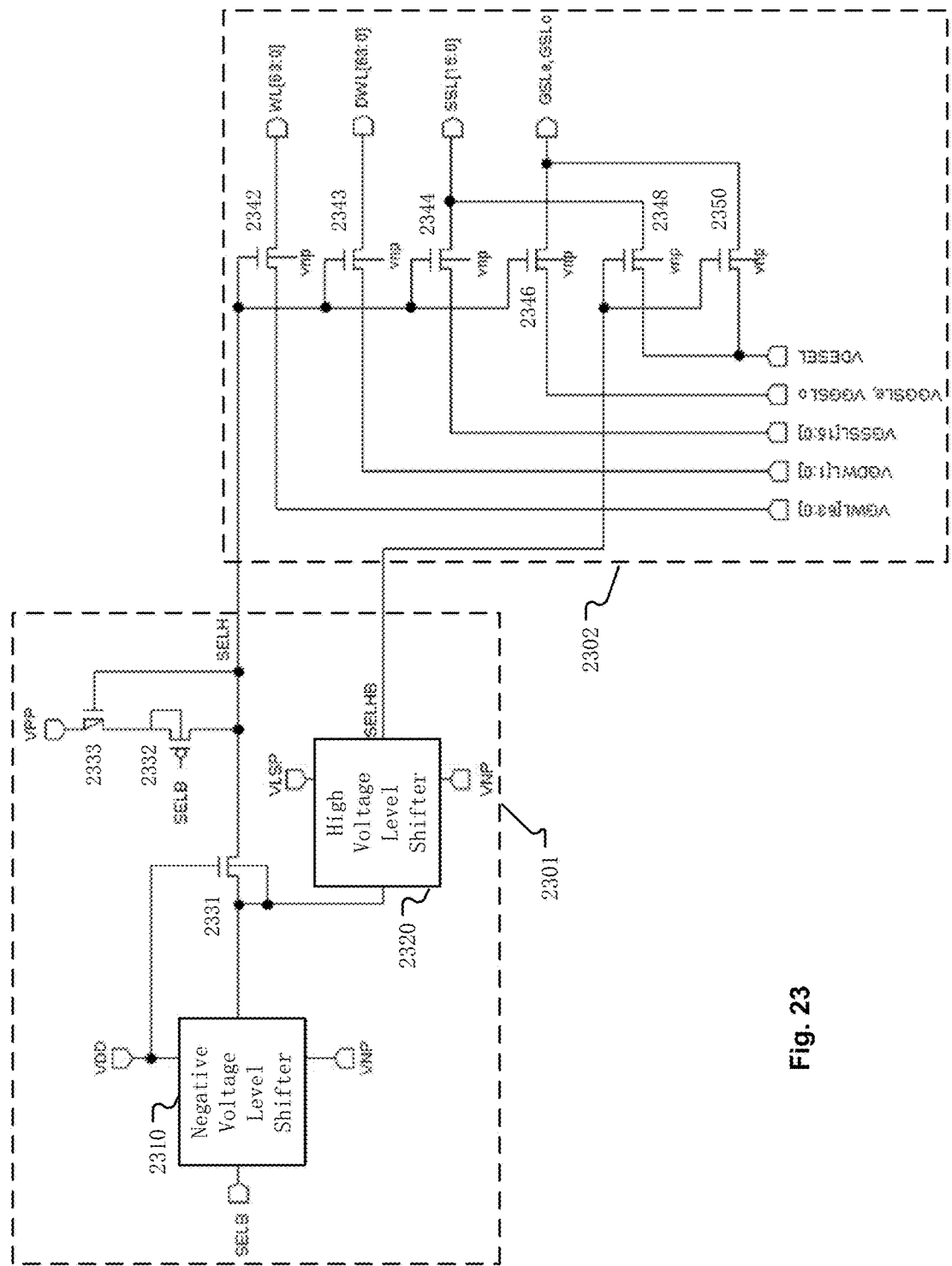
FIG. 23 shows a level shifting stage and a pass transistor stage of the block diagram.

FIG. 23 shows a level shifting stage and a pass transistor stage of the block diagram.

The level shifter receives signal SELB from a decoding stage such as FIG. 9, and generates output signals SELH and SELHB. The level shifter generates select and de-select signals for pass transistors of NAND strings in the memory array.

The level shifter includes multiple stages. A first stage includes a negative voltage shifter 2310 and widens the voltage range to VDD to VNP2. A second stage includes p-type transistor 2332 and n-type transistor 2333 and widens the voltage range to VPP to VNP.

Output signal SELH is generated after the second stage. So output signal SELH has a voltage range of VPP to VNP.

Output signal SELHB is generated from a high voltage level shifter 2320 after the first stage, not the second stage. The high voltage level shifter 2320 widens the voltage range to VLSP to VNP. VLSP is sufficiently high to turn on pass transistors which pass high voltage signals around VDD.

Accordingly, the level shifting stage generates signals SEL and SELHB for the pass transistor stage.

In one case, the word line or memory block is selected. SELH is high, turning on pass transistor 2342 and coupling global word line voltages VGWL[63:0] to word lines WL[63:0], turning on pass transistor 2343 and coupling global divided word line voltage VGDWL[1:0] to divided word lines DWL[63:0], turning on pass transistor 2344 and coupling global string select line voltages VGSSL[15:0] to string select lines SSL[15:0], and turning on pass transistor 2346 and coupling even and odd global ground select line voltages VGGSLe and VGGSLo to even and odd ground select lines GSLe and GSLo. SELHB is low, turning off pass transistor 2348 and decoupling VDESEL from string select lines SSL[15:0], and turning off pass transistor 2350 and decoupling even and odd global ground select line voltages VGGSLe and VGGSLo from even and odd ground select lines GSLe and GSLo.

In another case, the word line or memory block is de-selected. SELH is low, turning off pass transistor 2342 and decoupling global word line voltages VGWL[63:0] from word lines WL[63:0], turning off pass transistor 2343 and decoupling global divided word line voltage VGDWL [1:0] from divided word lines DWL[63:0], turning off pass transistor 2344 and decoupling global string select line voltages VGSSL[15:0] from string select lines SSL[15:0], and turning off pass transistor 2346 and decoupling even and odd global ground select line voltages VGGSLe and VGGSLo from even and odd ground select lines GSLe and GSLo. SELHB is high, turning on pass transistor 2348 and coupling VDESEL to string select lines SSL[15:0], and turning on pass transistor 2350 coupling VDESEL to even and odd ground select lines GSLe and GSLo.

Because of the high voltage level shifter 2320, SELHB with VLSP is sufficiently high to turn on pass transistors 2348 and 2350 to pass VDESEL, even if VDESEL is a high voltage signal around VDD. VLSP has a value of at least VDESEL+Vtn.

Other embodiments include a different number of signal types, including more or fewer. Other embodiments include a different number of lines of a signal type. For example, there may be more or fewer word lines, and more or fewer string select lines.

Figure 24:
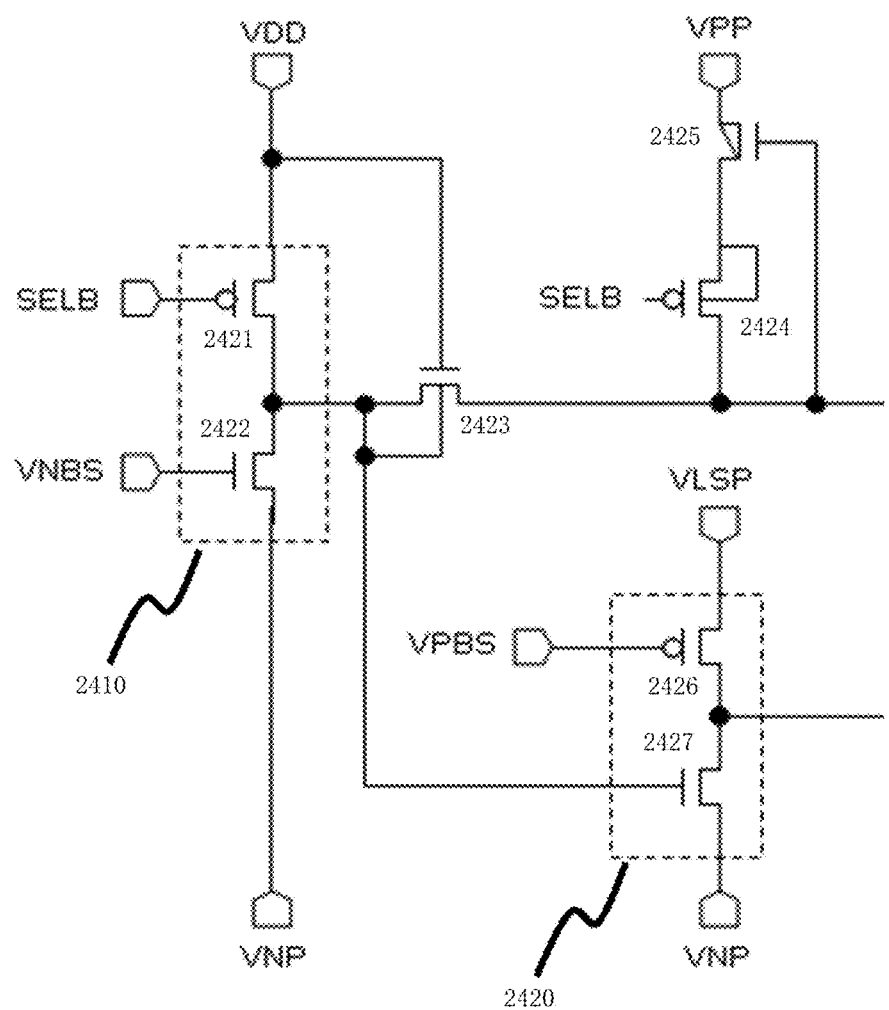
FIG. 24 shows an example of the level shifting stage of FIG. 24.

FIG. 24 shows an example of the level shifting stage of FIG. 24.

The negative voltage level shifter 2410 includes p-type transistor 2421 receiving SELB and n-type transistor 2422 receiving VNBS, and widens the voltage range to VDD to VNP. VNBS is VNP+delta V that weakly turns on n-type transistor 2422, as delta V has a magnitude less than the threshold voltage magnitude of n-type transistor 2422.

The high voltage level shifter 2420 includes p-type transistor 2426 receiving VPBS and n-type transistor 2427 receiving the output of the negative voltage level shifter 2410, and widens the voltage range to VLSP to VNP. VPBS is VLSP−delta V that weakly turns on p-type transistor 2426, as delta V has a magnitude less than the threshold voltage magnitude of p-type transistor 2426.

Figure 25:
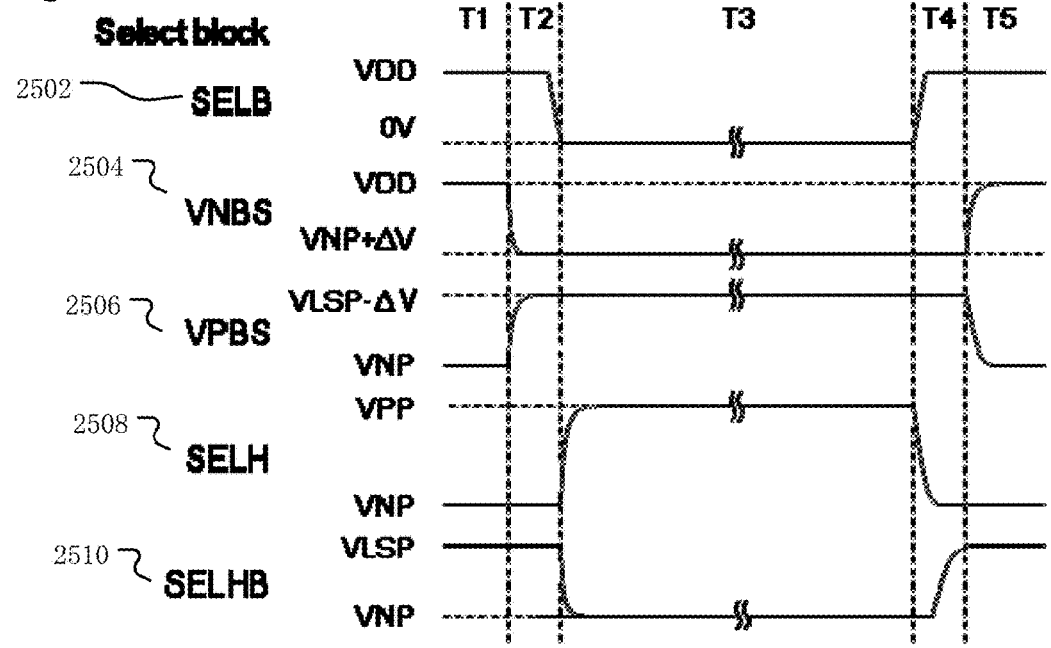
FIG. 25 shows voltage traces of the level shifter in FIG. 24, processing select block signals.

FIG. 25 shows voltage traces of the level shifter in FIG. 24, processing select block signals. The voltage traces include SELB 2502, VNBS 2504, VPBS 2506, SELH 2508, and SELHB 2510. Operation is generally similar to FIG. 6.

Figure 26:
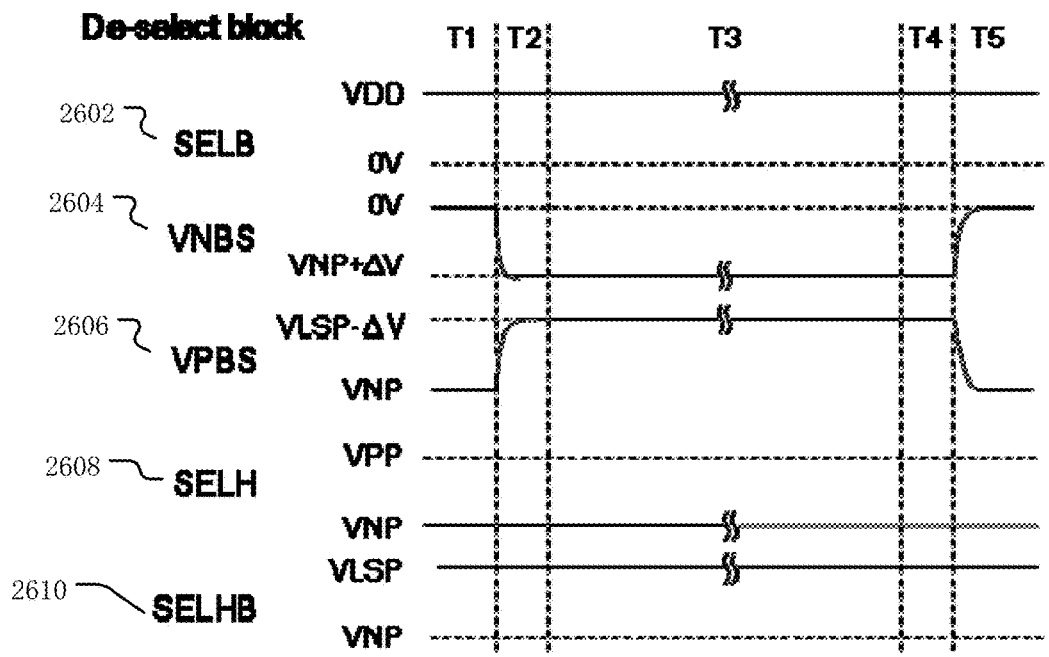
FIG. 26 shows voltage traces of the level shifter in FIG. 24, processing de-select block signals.

FIG. 26 shows voltage traces of the level shifter in FIG. 24, processing de-select block signals. The voltage traces include SELB 2602, VNBS 2604, VPBS 2606, SELH 2608, and SELHB 2610. Operation is generally similar to FIG. 7.

FIGS. 25 and 26 differ from FIGS. 6 and 7 by including a voltage trace for weakly turning on a p-type transistor to weakly turn on a p-type transistor to limit crossbar current through p-type transistor 2426.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a level shifter receiving a first input with a first voltage range, and providing a first output with a second voltage range different from the first voltage range, the level shifter including a first transistor with a threshold voltage having a first magnitude, the first transistor having a control terminal and a current-carrying terminal;
control circuitry having a first mode causing the first current-carrying terminal of the first transistor to be coupled to a reference voltage and the control terminal of the first transistor to be coupled to a control voltage, the control voltage being greater than the reference voltage wherein a nonzero difference between the reference voltage and the control voltage has a second magnitude less than the first magnitude.

2. The circuit of claim 1, wherein the reference voltage and the control voltage are non-positive.

3. The circuit of claim 1, wherein the first transistor is a field effect transistor, and the control circuitry causing the first transistor to be coupled to the reference voltage and the control voltage results in the field effect transistor conducting current out of saturation.

4. The circuit of claim 1, wherein the level shifter includes the first transistor and a second transistor coupled in series in between a first positive reference voltage and the reference voltage, the first transistor being n-type, the second transistor being p-type, the first transistor and the second transistor having drains coupled together.

5. The circuit of claim 4, wherein the control circuitry includes a second mode in which the first transistor receives at least the threshold voltage across the control terminal and the current-carrying terminal, and the second transistor is turned off.

6. The circuit of claim 1, wherein the first voltage range has a first range maximum and a first range minimum, the second voltage range has a second range maximum and a second range minimum, the second range maximum being greater than the first range maximum, the second range minimum being less than the first range minimum.

7. The circuit of claim 1, wherein the first input of the level shifter is a decoder signal and the first output of the level shifter is coupled to a pass transistor of a word line of a memory array.

8. The circuit of claim 1, wherein the level shifter includes a plurality of stages including:
a first stage providing a first stage voltage output with a first stage voltage range, the first stage voltage range having a first stage minimum and a first stage maximum, the first stage minimum determined by the reference voltage, the first stage including the first transistor; and
a second stage receiving the first stage voltage output, the second stage circuit providing a second stage voltage output with a second stage voltage range wider than the first voltage range, the second stage voltage range having a second stage maximum greater than the first stage maximum.

9. The circuit of claim 8, wherein the second stage includes a first n-type transistor coupled in series with a first p-type transistor, the first n-type transistor and the first p-type transistor having sources coupled together, the second stage voltage output coupled to a gate of the first n-type transistor and a drain of the first p-type transistor, the first n-type transistor having a drain coupled to a positive voltage reference determining the second stage maximum.

10. A method, comprising:
providing to the level shifter a first input with a first voltage range, the level shifter providing a first output with a second voltage range different from the first voltage range, the level shifter including a first transistor, the first transistor having a control terminal and a current-carrying terminal, the first transistor having a threshold voltage with a first magnitude; and
least partly during said providing, applying a bias arrangement to the first transistor in the level shifter, the bias arrangement including a reference voltage coupled to the first current-carrying terminal of the first transistor and a control voltage coupled to the control terminal of the first transistor, the control voltage being greater than the reference voltage, wherein a nonzero difference between the reference voltage and the control voltage has a second magnitude less than the first magnitude.

11. The method of claim 10, wherein the reference voltage and the control voltage are non-positive.

12. The method of claim 10, wherein the first transistor is a field effect transistor, and the method causing the first transistor to be coupled to the reference voltage and the control voltage results in the field effect transistor conduct current out of saturation.

13. The method of claim 10, wherein the level shifter includes the first transistor and a second transistor coupled in series in between a first positive reference voltage and the reference voltage, the first transistor being n-type, the second transistor being p-type, the first transistor and the second transistor having drains coupled together.

14. The method of claim 13, further comprising:
applying another bias arrangement to the n-type transistor in the level shifter in which then-type transistor receives at least the threshold voltage across the control terminal and the current-carrying terminal, and the p-type transistor is turned off.

15. The method of claim 10, wherein the first voltage range has a first range maximum and a first range minimum, the second voltage range has a second range maximum and a second range minimum, the second range maximum being greater than the first range maximum, the second range minimum being less than the first range minimum.

16. The method of claim 10, wherein the first input of the level shifter is a decoder signal and the first output of the level shifter is coupled to a pass transistor of a word line of a memory array.

17. The method of claim 10, wherein the level shifter includes a plurality of stages including:
a first stage providing a first stage voltage output with a first stage voltage range, the first stage voltage range having a first stage minimum and a first stage maximum, the first stage minimum determined by the reference voltage, the first stage including the first transistor; and
a second stage receiving the first stage voltage output, the second stage circuit providing a second stage voltage output with a second stage voltage range wider than the first voltage range, the second stage voltage range having a second stage maximum greater than the first stage maximum.

18. The method of claim 17, wherein the second stage includes a first n-type transistor coupled in series with a first p-type transistor, the first n-type transistor and the first p-type transistor having source coupled together, the second stage voltage output coupled to the a gate of the first n-type transistor and a drain of the first p-type transistor, the first n-type transistor having a drain coupled to a positive voltage reference determining the second stage maximum.

19. An integrated circuit, comprising:
a NAND memory array divided into a plurality of NAND sub-arrays;
a plurality of word lines divided across the plurality of NAND sub-arrays;
a plurality of decoders accessing the plurality of NAND sub-arrays, wherein decoders in the plurality include:
a level shifter receiving a first input with a first voltage range, and providing a first output with a second voltage range different from the first voltage range, the level shifter including a first transistor with a threshold voltage having a first magnitude, the first transistor having a control terminal and a current-carrying terminal; and
control circuitry having a first mode causing the first current-carrying terminal of the first transistor to be coupled to a reference voltage and the control terminal of the first transistor to be coupled to a control voltage, the control voltage being greater than the reference voltage, a nonzero difference between the reference voltage and the control voltage having a second magnitude less than the first magnitude.

* * * * *

UNITED STATES PATENT AND TRADEMARK OFFICE
CERTIFICATE OF CORRECTION

PATENT NO.       : 9,589,642 B2
APPLICATION NO.  : 14/454510
DATED            : March 7, 2017
INVENTOR(S)      : Ming-Yi Chang et al.

Page 1 of 1

It is certified that error appears in the above-identified patent and that said Letters Patent is hereby corrected as shown below:

In the Claims

In Claim 10, Column 13, Line 14, insert --at-- before "least".

Signed and Sealed this
Twenty-third Day of May, 2017

Michelle K. Lee
*Director of the United States Patent and Trademark Office*